(12) United States Patent
Fujiwara

(10) Patent No.: US 8,179,517 B2
(45) Date of Patent: May 15, 2012

(54) EXPOSURE APPARATUS AND METHOD, MAINTENANCE METHOD FOR EXPOSURE APPARATUS, AND DEVICE MANUFACTURING METHOD

(75) Inventor: Tomoharu Fujiwara, Ageo (JP)

(73) Assignee: Nikon Corporation, Tokyo (JP)

( * ) Notice: Subject to any disclaimer, the term of this patent is extended or adjusted under 35 U.S.C. 154(b) by 662 days.

(21) Appl. No.: 11/915,886

(22) PCT Filed: Jun. 30, 2006

(86) PCT No.: PCT/JP2006/313086
§ 371 (c)(1),
(2), (4) Date: Nov. 29, 2007

(87) PCT Pub. No.: WO2007/004552
PCT Pub. Date: Jan. 11, 2007

(65) Prior Publication Data
US 2009/0323035 A1   Dec. 31, 2009

(51) Int. Cl.
*G03B 27/52* (2006.01)
(52) U.S. Cl. .................. 355/30; 355/53; 355/67
(58) Field of Classification Search .......... 355/30, 355/53, 67
See application file for complete search history.

(56) References Cited

U.S. PATENT DOCUMENTS

| | | |
|---|---|---|
| 4,346,164 A | 8/1982 | Tabarelli et al. |
| 4,480,910 A | 11/1984 | Takanashi et al. |
| 5,473,410 A | 12/1995 | Nishi |
| 5,610,683 A | 3/1997 | Takahashi et al. |
| 5,715,039 A | 2/1998 | Fukuda et al. |
| 5,825,043 A | 10/1998 | Suwa |
| 5,969,441 A | 10/1999 | Loopstra et al. |
| 6,208,407 B1 | 3/2001 | Loopstra |
| 6,590,634 B1 | 7/2003 | Nishi et al. |
| 6,597,002 B1 | 7/2003 | Kondo |
| 6,611,316 B2 | 8/2003 | Sewell |
| 6,778,257 B2 | 8/2004 | Bleeker et al. |
| 6,897,963 B1 | 5/2005 | Taniguchi et al. |
| 6,952,253 B2 | 10/2005 | Lof et al. |
| 2001/0055103 A1 * | 12/2001 | Nishi .................. 355/53 |

(Continued)

FOREIGN PATENT DOCUMENTS

DE     221563 A1     9/1983

(Continued)

OTHER PUBLICATIONS

Written Opinion issued on the counterpart PCT Patent Application No. PCT/JP2006/313086 on Aug. 8, 2006.

(Continued)

*Primary Examiner* — Edward Glick
*Assistant Examiner* — Mesfin T Asfaw
(74) *Attorney, Agent, or Firm* — Miles & Stockbridge P.C.

(57) ABSTRACT

An exposure apparatus (EX) includes a setting apparatus (45) that sets an irradiation region (AR) of exposure light (EL) in a first state in which the irradiation light (EL) is irradiated onto a substrate (P) and irradiates, in a second state in which the exposure light (EL) is not irradiated onto the substrate (P), the exposure light (EL) onto a second region, which is different from a first region through which the exposure light (EL) passes in the first state, of a first surface of an optical member (FL) that is contacted with a liquid (LQ), to clean the second region by photochemical action.

28 Claims, 11 Drawing Sheets

U.S. PATENT DOCUMENTS

| | | | |
|---|---|---|---|
| 2003/0197849 A1* | 10/2003 | Ishikawa et al. | 355/69 |
| 2004/0165159 A1 | 8/2004 | Lof et al. | |
| 2004/0239900 A1* | 12/2004 | Aoyama et al. | 355/30 |
| 2005/0007569 A1* | 1/2005 | Streefkerk et al. | 355/30 |
| 2005/0280791 A1 | 12/2005 | Nagasaka et al. | |
| 2006/0119812 A1* | 6/2006 | Kruijswijk et al. | 355/53 |
| 2009/0225286 A1 | 9/2009 | Nagasaka et al. | |

FOREIGN PATENT DOCUMENTS

| | | |
|---|---|---|
| DE | 224448 A1 | 7/1985 |
| EP | 0 874 283 A2 | 10/1998 |
| EP | 1 571 695 A1 | 12/2003 |
| EP | 1 598 855 A1 | 2/2004 |
| EP | 1420298 A2 | 5/2004 |
| EP | 1783822 A1 | 5/2007 |
| JP | 58-202448 A | 11/1983 |
| JP | 59-019912 A | 2/1984 |
| JP | 62-065326 A | 3/1987 |
| JP | 63-157419 A | 6/1988 |
| JP | 04-196513 A | 7/1992 |
| JP | 04-305915 A | 10/1992 |
| JP | 04-305917 A | 10/1992 |
| JP | 05-062877 A | 3/1993 |
| JP | 06-124873 A | 5/1994 |
| JP | 07-220990 A | 8/1995 |
| JP | 08-316125 A | 11/1996 |
| JP | 10-163099 A | 6/1998 |
| JP | 10-214783 A | 8/1998 |
| JP | 10-303114 A | 11/1998 |
| JP | 10-340846 A | 12/1998 |
| JP | 11-135400 A | 5/1999 |
| JP | 11-176727 A | 7/1999 |
| JP | 2000-058436 A | 2/2000 |
| JP | 2000-091207 A | 3/2000 |
| JP | 2000-505958 T | 5/2000 |
| JP | 2000-164504 A | 6/2000 |
| JP | 2001-510577 T | 7/2001 |
| JP | 2004/519850 T | 2/2004 |
| JP | 2004-289126 A | 10/2004 |
| JP | 2005-101488 A | 4/2005 |
| JP | 2005-109426 A | 4/2005 |
| JP | 2005/116571 | 4/2005 |
| JP | 2005-116571 A | 4/2005 |
| WO | WO 99/23692 | 5/1999 |
| WO | WO 99/28790 | 6/1999 |
| WO | WO 99/49504 A1 | 9/1999 |
| WO | WO 99/63585 | 12/1999 |
| WO | WO 01/035168 A1 | 5/2001 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/093130 A2 | 10/2004 |
| WO | WO 2005/029559 A1 | 3/2005 |
| WO | WO 2005/124833 A1 | 12/2005 |

OTHER PUBLICATIONS

European Search Report issued in Application No. 06767694.0 issued May 30, 2011.

Office Action issued Dec. 20, 2011 in Japanese Application No. 2007-524022.

* cited by examiner

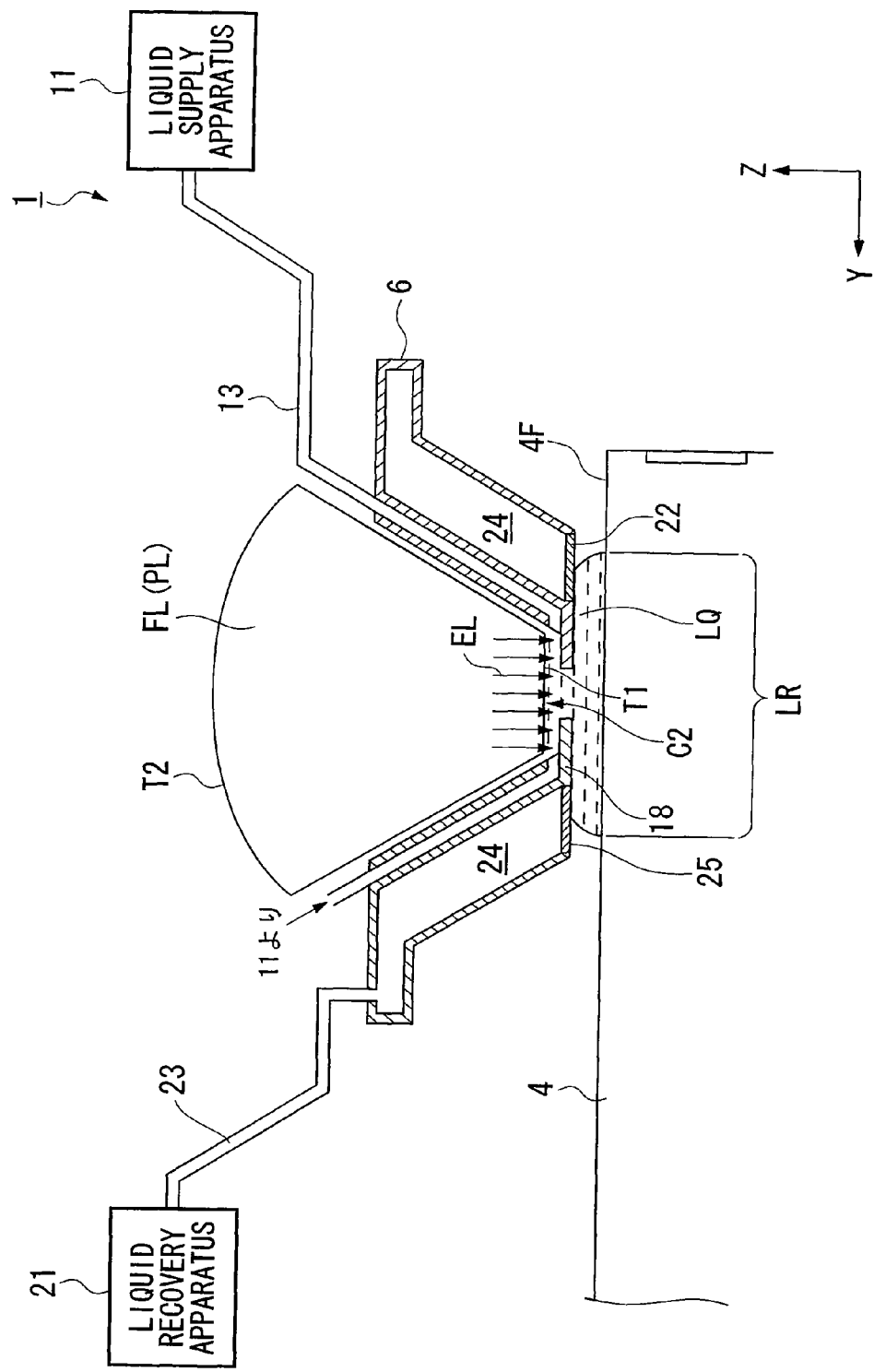

EXPOSURE APPARATUS AND METHOD, MAINTENANCE METHOD FOR EXPOSURE APPARATUS, AND DEVICE MANUFACTURING METHOD

TECHNICAL FIELD

The present invention relates to an exposure apparatus and method that exposes a substrate via a liquid, a maintenance method for an exposure apparatus, and a device manufacturing method.

Priority is claimed on Japanese Patent Application No. 2005-191561, filed on Jun. 30, 2005, the contents of which are incorporated herein by reference.

BACKGROUND ART

In the photolithography process which is one manufacturing process for micro devices such as semiconductor devices and the like, an exposure apparatus is used which exposes a pattern image of a mask onto a photosensitive substrate. This exposure apparatus has a mask stage for holding a mask and a substrate stage for holding a substrate, and exposes a pattern image of the mask on the substrate via a projection optical system. In the manufacture of a micro device, in order to increase the density of the device, it is necessary to make the pattern formed on the substrate fine. In order to address this necessity, even higher resolution of the exposure apparatus is desired. As one means for realizing this higher resolution, there is proposed a liquid immersion exposure apparatus as disclosed in the following Patent Document, in which a liquid is filled in an optical path space of the exposure light between a projection optical system and a substrate, and the substrate is exposed via the projection optical system and the liquid.

Patent Document: PCT International Publication No. WO 99/49504

DISCLOSURE OF INVENTION

Problems to be Solved by the Invention

Incidentally, when the optical space between the projection optical system and the substrate is filled with a liquid, there is a possibility that impurities generated from a surface of the substrate are mixed in the liquid. When the liquid including impurities is contacted with an optical member of the projection optical system, there is a possibility that the optical member is contaminated. Contamination of an optical member brings about a deterioration of the performance of the exposure apparatus.

A purpose of some aspects of the invention is to provide an exposure apparatus and method that is capable of preventing a deterioration of a performance thereof even when a liquid immersion method is applied, and to provide a device manufacturing method using the exposure apparatus and method. Furthermore, the present invention has another object to provide a maintenance method that is capable of preventing a deterioration of the performance of an exposure apparatus that uses a liquid immersion method.

Means for Solving the Problem

According to a first aspect of the present invention, there is provided an exposure apparatus that exposes a substrate by irradiating the substrate with exposure light via a liquid, the apparatus including: an optical member that has a first surface to be contacted with the liquid; and a setting apparatus that sets an irradiation region of the exposure light in a first state in which the exposure light is irradiated onto the substrate, wherein in which in a second state in which the exposure light is not irradiated onto the substrate, the exposure light is irradiated onto a second region, which is different from a first region through which the exposure light passes in the first state, of the first surface of the optical member, to clean the second region by photochemical action.

According to a second aspect of the present invention, there is provided an exposure apparatus that exposes a substrate via a liquid, including: an optical member that has a first surface to be contacted with the liquid; and a setting apparatus that sets an irradiation region of exposure light. The setting apparatus has: an exposure mode in which the exposure light is irradiated onto the substrate via a first region of the first surface of the optical member; and a photochemical cleaning mode in which the exposure light is irradiated onto a second region of the first surface of the optical member.

According to the first and second aspects of the present invention, the second region of the first surface that is contacted with the liquid of the optical member can be cleaned by photochemical action. Therefore, a deterioration of the performance of the exposure apparatus can be prevented.

According to a third aspect of the present invention, there is provided a device manufacturing method using the exposure apparatus of the above aspects.

According to the third aspect of the present invention, devices can be manufactured using the exposure apparatus whose performance is prevented from deteriorating.

According to a fourth aspect of the present invention, there is provided a maintenance method for an exposure apparatus that exposes a substrate with exposure light via an optical member and a liquid, in which the exposure light is irradiated onto a second region, which is different from a first region through which the exposure light passes when the exposure light is irradiated onto the substrate, of a first surface of the optical member that is contacted with the liquid, to clean the second region by photochemical action.

According to a fifth aspect of the present invention, there is provided an exposure method, including: irradiating a substrate with exposure light via a liquid and an optical member, the optical member having a first surface that is contacted with the liquid, the exposure light passing through a first region of the first surface of the optical member; and irradiating a second region of the first surface of the optical member with the exposure light to clean the second region by photochemical action.

According to the fourth and fifth aspects of the present invention, the second region on the first surface that is contacted with the liquid of the optical member can be cleaned by photochemical action. Therefore, a deterioration of the performance of the exposure apparatus can be prevented.

BRIEF DESCRIPTION OF THE DRAWINGS

FIG. 9 is a diagram for explaining a maintenance method according to a fourth embodiment.

BEST MODE FOR CARRYING OUT THE INVENTION

Hereunder is a description of embodiments of the present invention with reference to the drawings. However, the present invention is not limited to this description.

<First Embodiment>

Figure 1:
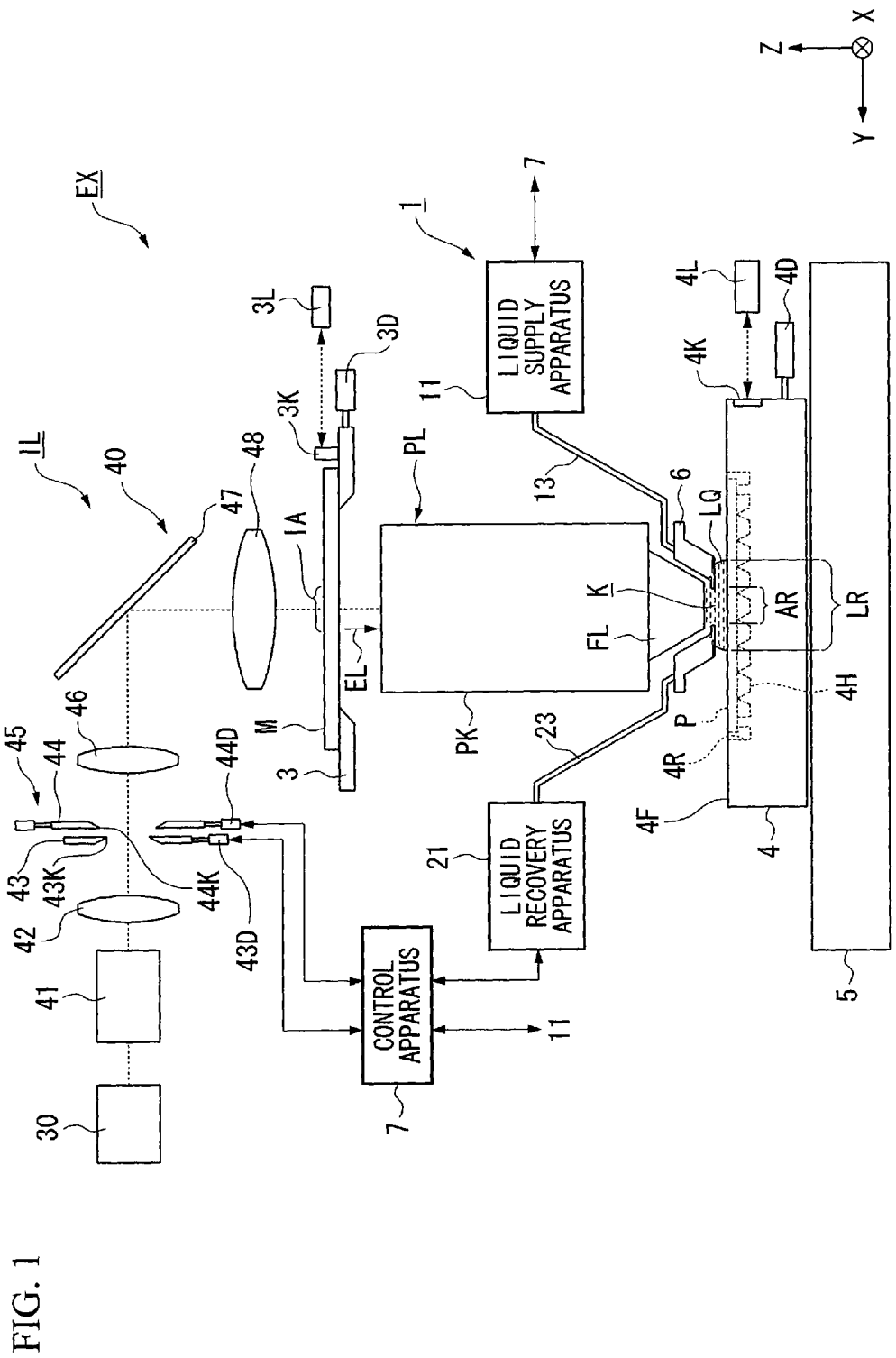
FIG. 1 is a schematic block diagram showing an exposure apparatus according to a first embodiment.

A first embodiment will be explained. FIG. 1 is a schematic block diagram showing an exposure apparatus EX according to a first embodiment. In FIG. 1, the exposure apparatus EX includes: a mask stage 3 capable of holding and moving a mask M; a substrate stage 4 capable of holding and moving a substrate P; an illumination system IL for illuminating a mask M held on the mask stage 3 with exposure light EL; a projection optical system PL for projecting a pattern image of the mask M illuminated by the exposure light EL onto the substrate P; and a control apparatus 7 for controlling operation of the whole exposure apparatus EX.

The substrate here includes one at least one layer of a sensitive material (photoresist) or of a film such as a protection film (topcoat film) and anti-reflection film is spread on a base material such as a semiconductor wafer or the like, and the mask includes a reticle formed with a device pattern which is reduction size projected onto the substrate. In the present embodiment, a transmission mask is used as the mask. However, a reflecting mask may be used.

The exposure apparatus EX of the present embodiment is an immersion exposure apparatus to which an immersion method is applied for substantially shortening the exposure wavelength and improving the resolution, and also substantially expanding the depth of focus. The exposure apparatus EX includes a liquid immersion mechanism 1 for filling an optical path space K of exposure light EL on an image plane of a projection optical system PL with a liquid LQ and forming a liquid immersion region LR of the liquid LQ on the substrate P. The exposure apparatus EX uses the liquid immersion mechanism 1 during exposure of the pattern image of the mask M at least onto the substrate P, to fill the optical path space K of the exposure light EL with the liquid LQ. The exposure apparatus EX illuminates exposure light EL which has passed through the mask M via the projection optical system PL and the liquid LQ which is filled in the optical path space K, onto substrate P, to thereby expose the pattern image of the mask M onto the substrate P. Furthermore, the exposure apparatus EX of the present embodiment adopts a local liquid immersion method where the liquid LQ which fills the optical path space K locally forms a liquid immersion region LR which is greater than a projection region AR, and smaller than the substrate P, on a region of one part of the substrate P which includes the projection region AR of the projection optical system PL. In the present embodiment, pure water is used as the liquid LQ.

In the present embodiment, a description will be made of the case where, as the exposure apparatus EX, a scanning type exposure apparatus (a so called scanning stepper) which exposes the pattern formed on the mask M onto the substrate P while the mask M and the substrate P are synchronously moved in a scanning direction is used by way of example. In the following description, the synchronous movement direction (the scanning direction) of the mask M and the substrate P in a horizontal plane is made the Y axis direction, the direction orthogonal to the Y axis direction in the horizontal plane is made the X axis direction (the non-scanning direction), and the direction orthogonal to the X axis and Y axis directions (in this embodiment, the direction in parallel with an optical axis of the projection optical system PL) is made the Z axis direction. Furthermore, rotation (inclination) directions about the X axis, the Y axis and the Z axis, are made the θX, the θY, and the θZ directions respectively.

The illumination system IL includes a light source 30 and an illumination optical system 40. It illuminates a predetermined illumination region IA on the mask M with exposure light EL of a uniform luminance distribution. For the exposure light EL radiated from the illumination system IL, for example emission lines (g-line, h-line, i-line), radiated for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In the present embodiment, an ArF excimer laser apparatus is used as the light source 30, and the ArF excimer laser beam is used as the exposure light EL.

The illumination optical system 40 includes: a luminance uniforming optical system 41 including a collimating lens and an optical integrator such as a fly-eye lens; relay optical systems 42 and 46; a blind apparatus 45 including a first blind 43 and a second blind 44; a mirror 47; and a condenser lens 48.

The blind apparatus 45 is provided on the optical path of the exposure light EL. It is capable of adjusting an irradiation region (illumination region) IA of the exposure light EL on the mask M and an irradiation region (projection region) AR of the exposure light EL on the substrate P. The blind apparatus 45 of the present embodiment includes: the first blind 43 provided on the optical path of the exposure light EL for forming an opening 43K for setting the irradiation region (illumination region) IA of the exposure light EL on the mask M; and a second blind 44 for further limiting the illumination region IA for prevention of exposure of unnecessary portions at the start and end of the scan exposure, as disclosed for example in Japanese Patent Application, Publication No. H04-196513 (corresponding to U.S. Pat. No. 5,473,410) or PCT International Publication No. WO 99/63585 (corresponding to U.S. Pat. No. 6,597,002). Furthermore, the blind apparatus 45 of the present embodiment includes: a first driving unit 43D for driving the first blind 43; and a second driving unit 44D for driving the second blind 44. The first blind 43 includes the opening 43K for setting the illumination region IA on the mask M. It is arranged on a plane slightly defocused from a conjugate plane with respect to a pattern plane of the mask M. In the present embodiment, the opening 43K of the first blind 43 is formed in a rectangular shape (a slit shape). Setting the irradiation region (illumination region) IA of the exposure light EL on the mask M by the first blind 43 of the blind apparatus 45 leads to setting the irradiation region (projection region) AR of the exposure light EL on the substrate P.

Appropriate adjustment of the opening 43K of the first blind 43 allows adjustment of the irradiation region (illumination region) IA of the exposure light EL on the mask M and the projection region (irradiation region) AR of the exposure light EL on the substrate P.

The second blind 44 is arranged in the vicinity of the first blind 43. It has an opening 44K that is variable in position and width in the directions respectively corresponding to the scanning direction (Y axis direction) and the non-scanning direction (X axis direction) of the mask M. The second blind 44 is made of a plurality of combined plate-shaped members. The control apparatus 7 can adjust the size of the opening 44K by driving the plate-shaped members by use of the second driving unit 44D, to thereby shield a part of the exposure light EL. The blind apparatus 45 prevents exposure of unnecessary portions by further limiting the illumination region IA via the second blind 44 at the start and end of the scan exposure.

In the adjustment in width of the illumination region IA (the projection region AR) related to at least either one of the scanning direction (the Y axis direction) and the non-scanning direction (the X axis direction), the second blind 44 may be used instead of or in combination with the first blind 43. Moreover, for example, in the case where an inner surface reflection type optical integrator (such as a rod) is used as the optical integrator, its exit surface may be used as the first blind 43, and thus only the second blind 44 may be provided for adjustment of the illumination region IA (the projection region AR). Furthermore, although the first and second blinds 43 and 44 are described as being arranged within the illumination system, the configuration is not limited thereto. They may be arranged in the vicinity of a conjugate plane with respect to the pattern plane of the mask M or of one of the pattern plane and its conjugate plane. Moreover, either one of the first and second blinds 43 and 44 may be arranged on the upstream side, and they need not be arranged close to each other. It is preferable that a blind (an edge) used for adjusting the illumination region IA (the projection region AR) at least in width be arranged conjugate with the pattern plane of the mask M.

The action of the illumination system IL thus configured will be briefly described. The exposure light EL emitted from the light source 30 is adjusted into a uniform luminance distribution by the luminance uniforming optical system 41. The exposure light EL that has been emitted from the luminance uniforming optical system 41, after passing through a first relay lens 42, passes through the opening 43K of the first blind 43 and the second blind 44 of the blind apparatus 45. The exposure light EL that has passed through the blind apparatus 45, after passing through the second relay lens 46, has its optical path reflected by the mirror 47. The exposure light EL that has had its optical path reflected by the mirror 47, after passing through the condenser lens 48, illuminates the illumination region IA on the mask M held on the mask stage 3 with a uniform luminance distribution.

The mask stage 3 is moveable in the X axis, the Y axis, and the θZ direction in a condition holding the mask M, by means of drive from a mask stage driving unit 3D which includes an actuator such as a linear motor. Position information of the mask stage 3 (and consequently the mask M) is measured by a laser interferometer 3L. The laser interferometer 3L uses a movement mirror 3K which is provided on the mask stage 3 to measure the position information of the mask stage 3. The control apparatus 7 controls the mask stage driving unit 3D based on the measured results of the laser interferometer 3L, and controls the position of the mask M which is held in the mask stage 3.

The movement mirror 3K may include not only a plane mirror, but also a corner cube (retroreflector), and instead of securing the movement mirror 3K to the mask stage 3, a mirror surface may be used which is formed by mirror polishing for example the end face (side face) of the mask stage 3.

The projection optical system PL is one which projects a pattern image of the mask M onto the substrate P at a predetermined projection magnification, and has a plurality of optical elements, and these optical elements are held in a lens barrel PK. The projection optical system PL of the present embodiment is a reduction system with a projection magnification of for example ¼, ⅕, ⅛ or the like, and forms a reduced image of the mask pattern on the aforementioned illumination region IA and the conjugate projection region AR. The projection optical system PL may be a reduction system, an equal system or a magnification system. Furthermore, the projection optical system PL may include any one of; a refractive system which does not include a reflection optical element, a reflection system which does not include a refractive optical element, or a cata-dioptric system which includes a reflection optical system and a refractive optical system. Moreover, the projection optical system PL may form either an inverted image or an erect image. In the present embodiment, of the plurality of optical elements of the projection optical system PL, only the final optical element FL which is closest to the image plane of the projection optical system PL is contacted with the liquid LQ of the optical path space K.

The substrate stage 4 has a substrate holder 4H for holding the substrate P, and is capable of holding the substrate P held on the substrate holder 4H and moving above a base member 5. The substrate holder 4H is arranged in a recess portion 4R which is provided in the substrate stage 4, and an upper surface 4F of the substrate stage 4 other than the recess portion 4R becomes a flat surface of approximately the same height (flush) as the surface of the substrate P which is held in the substrate holder 4H. There may be a step between the surface of the substrate P which is held in the substrate holder 4H, and the upper surface 4F of the substrate stage 4. Only one part of the upper surface 4F of the substrate stage 4, for example, a predetermined region surrounding the substrate P (the recess portion 4R), may be approximately the same height as the surface of the substrate P. Furthermore, the substrate holder 4H may be formed as one with one part of the substrate stage 4. However, in the present embodiment, the substrate holder 4H and a part of the substrate stage 4 are made separate, and the substrate holder 4H is secured in the recess portion 4R by, for example, vacuum attraction.

The substrate stage 4 is moveable in a direction of six degrees of freedom of: the X axis, the Y axis, the Z axis, the θX, the θY and the θZ directions, in a condition with the substrate P held, by means of drive from a substrate stage driving unit 4D which includes an actuator such as a linear motor. Position information of the substrate stage 4 (and consequently the substrate P) is measured by a laser interferometer 4L. The laser interferometer 4L uses a movement mirror 4K which is provided on the substrate stage 4 to measure the position information of the substrate stage 4 in relation to the X axis, the Y axis, and the θZ directions. Furthermore, surface position information of the surface of the substrate P held in the substrate stage 4 (position information related to the Z axis, the θX, and the θY directions) is detected by a focus leveling detection system (not shown in the figure). The control apparatus 7 drives the substrate stage driving unit 4D based on the detection results of the laser interferometer 4L, and the detection results of the focus leveling detection system, to control the position of the substrate P which is held in the substrate stage 4.

The laser interferometer 4L may also be capable of measuring the position in the Z axis direction of the substrate stage 4, and the rotation information in the θX and the θY directions. More detail of this is disclosed for example in Published Japanese Translation No. 2001-510577 of PCT International Application (corresponding to PCT International Publication No. WO 1999/28790). Furthermore, instead of fixing the movement mirror 4K to the substrate stage 4, a reflection surface may be used where for example a part of the substrate stage 4 (the side face or the like) is formed by a mirror polishing process.

Furthermore, the focus leveling detection system is one which detects inclination information (rotation angle) for the θX and the θY directions of the substrate P by measuring position information for a plurality of measurement points for the Z axis direction of the substrate P. Regarding this plurality of measurement points, at least one part may be set within the liquid immersion region LR (or the projection region AR), or all of these may be set on the outside of the liquid immersion region LR. Moreover, when for example the laser interferometer 4L is capable of measuring the position information for the Z axis, the θX, and the θY directions of the substrate P, then the focus leveling detection system need not be provided so as to make it possible to measure the position information for the Z axis direction of the substrate P during the exposure operation of the substrate P, and the position of the substrate P in relation to the Z axis, the θX, and the θY directions may be controlled using the measurement results of the laser interferometer 4L, at least during the exposure operation.

Figure 2:
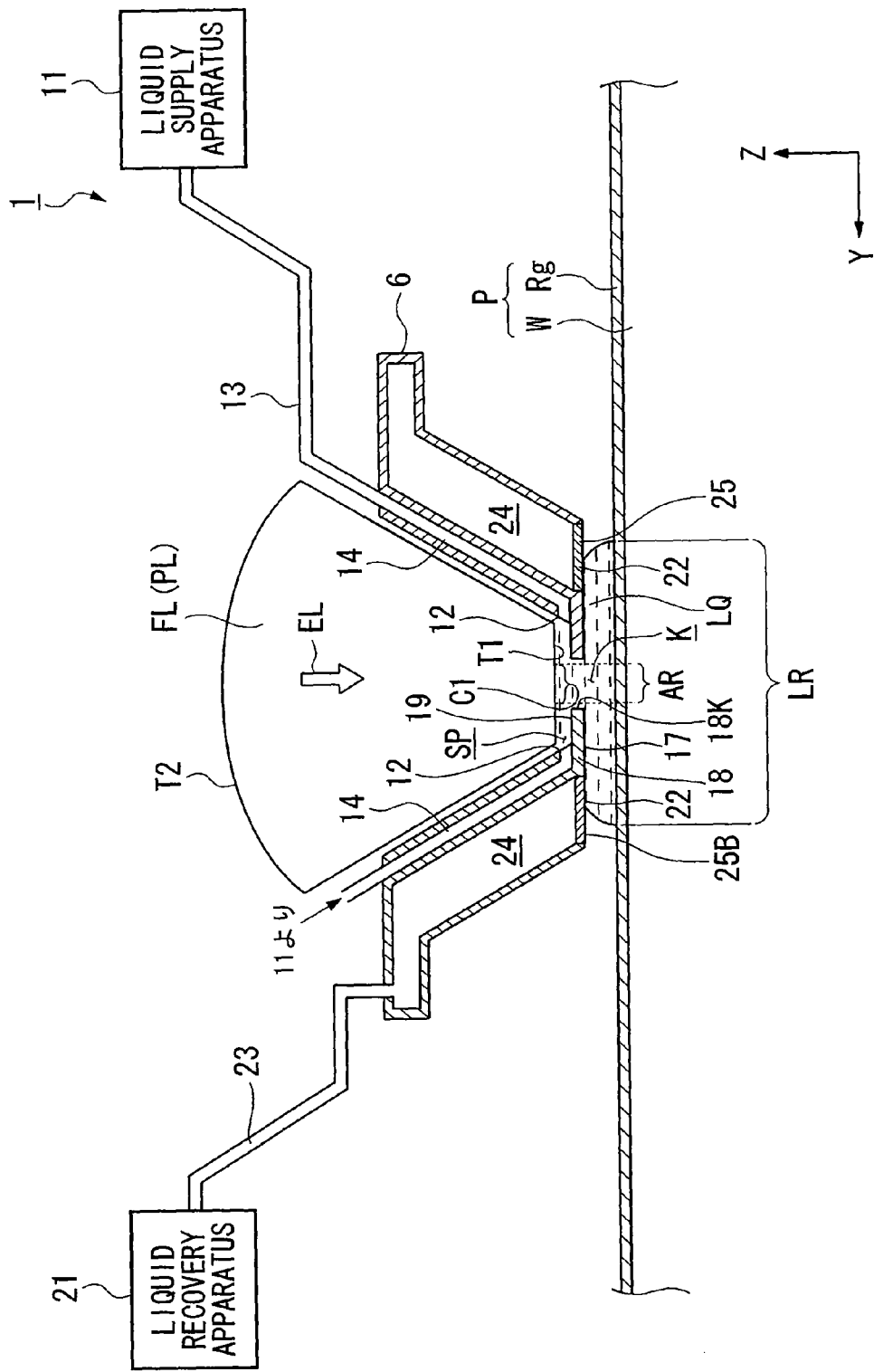
FIG. 2 is a side sectional view showing the main part of a liquid immersion mechanism.
Figure 3:
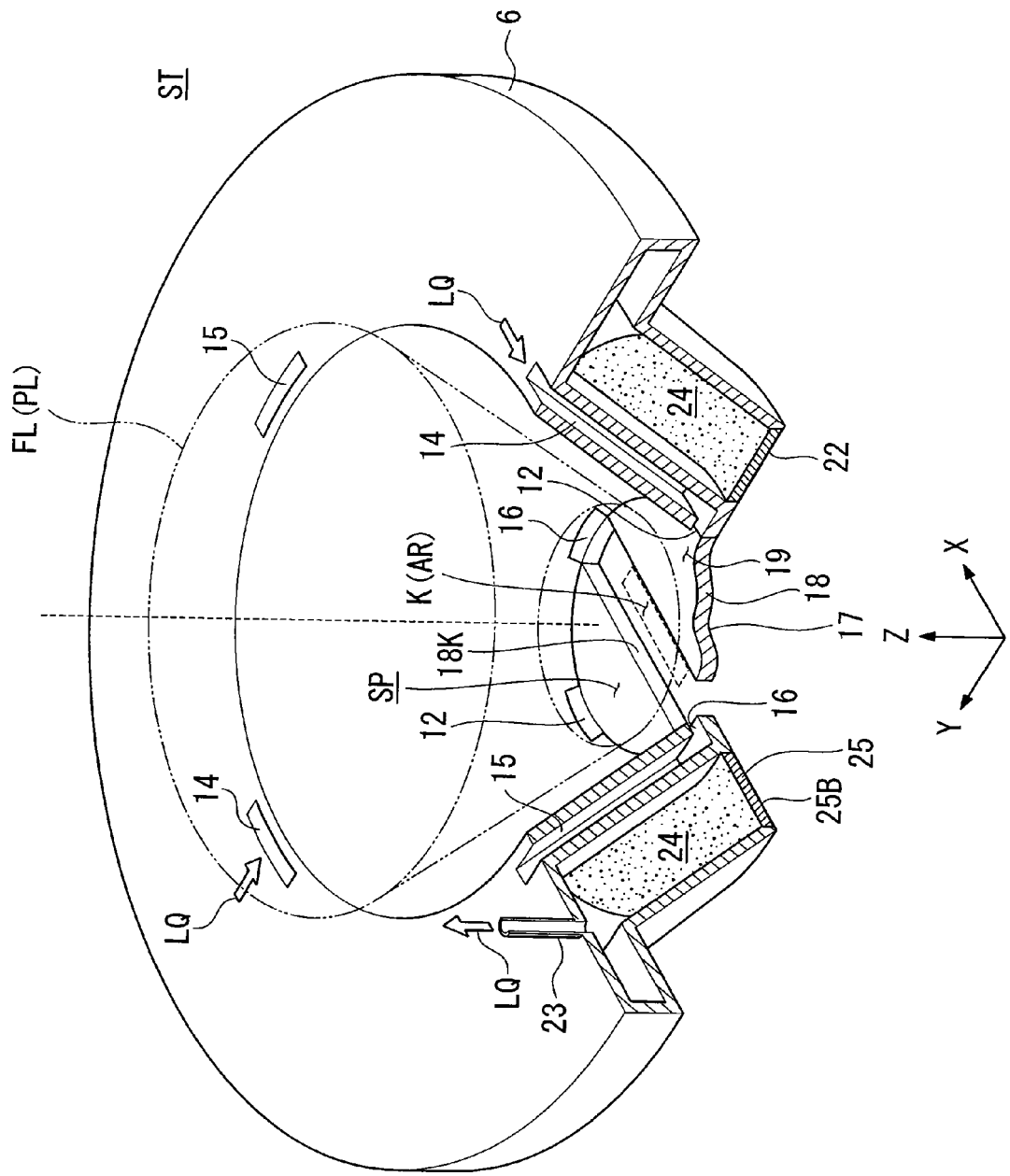
FIG. 3 is a perspective view showing the main part of a liquid immersion mechanism.

Next is a description of a liquid immersion mechanism 1 with reference to FIG. 2 and FIG. 3. FIG. 2 is a side sectional view showing the main part of the liquid immersion mechanism 1. FIG. 3 is a perspective view thereof. The liquid immersion mechanism 1 fills with the liquid LQ the optical path space K between the substrate P held in the substrate stage 4 and the final optical element FL of the projection optical system PL which is provided at the position facing the substrate P and through which the exposure light EL passes. The liquid immersion mechanism 1 includes: a nozzle member 6 that is provided in the vicinity of the optical path space K and that has supply ports 12 for supplying the liquid LQ to the optical path space K and a collection port 22 for recovering the liquid LQ; a liquid supply apparatus 11 for supplying the liquid LQ via supply pipes 13 and the supply ports 12 of the nozzle member 6; and a liquid recovery apparatus 21 for recovering the liquid via the collection port 22 of the nozzle member 6 and a recovery pipe 23. The nozzle member 6 is an annular member provided so as to surround the final optical element FL of the projection optical system PL. Furthermore, inside the nozzle member 6, supply passages 14 for connecting the supply ports 12 with the supply pipes 13 and a recovery passage 24 for connecting the collection port 22 with the recovery pipe 23 are formed. Operations of the liquid supply apparatus 11 and the liquid recovery apparatus 21 are controlled by the control apparatus 7. The liquid supply apparatus 11 can send out the clean, temperature-adjusted liquid LQ. The liquid recovery apparatus 21 including a vacuum system, etc., can recover the liquid LQ.

The nozzle member 6 has a bottom plate 18 with an upper surface 19 that faces the bottom surface T1 of the final optical element FL. A part of the bottom plate 18 is arranged between the bottom surface T1 of the final optical element FL the projection optical system PL and the substrate P (the substrate stage 4) with respect to the Z axis direction. Moreover, at the central portion of the bottom plate 18, there is formed an opening 18K through which the exposure light EL passes. The opening 18K is formed larger than the projection region AR onto which the exposure light EL is irradiated. This allows the exposure light EL that has passed through the projection optical system PL (the final optical element FL) to reach the substrate P without being shielded by the bottom plate 18. In the present embodiment, the opening 18K is formed in a substantially rectangular shape in a planar view, corresponding to the cross-section of the exposure light EL (i.e., the projection region AR). It is possible to appropriately change the shape of the opening 18K of the bottom plate 18 as long as it allows the exposure light EL to pass through.

Of the nozzle member 6, a bottom surface that faces the surface of the substrate P held in the substrate stage 4 is a flat surface that is parallel to the XY plane. The bottom surface of the nozzle member 6 includes a bottom surface 17 of the bottom plate 18. The surface of the substrate P held in the substrate stage 4 is substantially parallel to the XY plane. Therefore, the bottom surface 17 of the nozzle member 6 is provided so as to face the surface of the substrate P held in the substrate stage 4 and so as to be substantially parallel to the surface of the substrate P. In the following description, the bottom surface 17 of the nozzle member 6 (the bottom plate 18) is appropriately referred to as the land surface 17. The land surface 17 is a flat surface provided in the nozzle member 6 at a position closest to the substrate P held in the substrate stage 4. It is provided, between the bottom surface T1 of the final optical element FL of the projection optical system PL and the surface of the substrate P, so as to surround the optical path (the projection region AR) of the exposure light EL.

The distance between the surface of the substrate P and the bottom surface T1 of the final optical element FL is longer than that between the surface of the substrate P and the land surface 17. That is, the bottom surface T1 of the final optical element FL is provided at a position higher than that of the land surface 17. In the present embodiment, the distance between the surface of the substrate P and the bottom surface T1 of the final optical element FL is set to approximately 3 mm. The distance between the surface of the substrate P and the land surface 17 is set to approximately 1 mm.

Furthermore, it is configured such that the land surface 17 is contacted with the liquid LQ filled in the optical path space K. It is also configured such that the bottom surface T1 of the final optical element FL is contacted with the liquid LQ filled in the optical path space K. That is, the land surface 17 of the nozzle member 6 and the bottom surface T1 of the final optical element FL are liquid contact surfaces that are contacted with the liquid LQ filled in the optical path space K.

The bottom plate 18 is provided so as not to be contacted with the bottom surface T1 of the final optical element FL and the substrate P (the substrate stage 4). Between the bottom surface T1 of the final optical element FL and the upper surface 19 of the bottom plate 18, there is provided a space with a predetermined gap. In the following description, the space inside the nozzle member 6 including the space between the bottom surface T1 of the final optical element FL and the upper surface 19 of the bottom plate 18 is appropriately referred to as the internal space SP.

Inside the nozzle member 6, the supply passages 14 are provided that connect to the supply ports 12. The supply passage 14 is formed by a slit-shaped through-hole that passes through a part of the nozzle member 6. In the present embodiment, the supply passages 14 are provided respectively on both sides of the Y axis direction with respect to the optical path space K (the projection region AR). The upper ends of the supply passages 14 are connected with the liquid supply apparatus 11 via the supply pipes 13. On the other hand, the lower ends of the supply passages 14 are connected with the internal space SP between the final optical element FL and the bottom plate 18. These lower ends of the supply passages 14 work as the supply ports 12. Therefore, the supply ports 12 and the liquid supply apparatus 11 are connected via the supply pipes 13 and the supply passages 14. In the present embodiment, the supply ports 12 are provided, outside the optical path space K of the exposure light EL, respectively at a predetermined position on both sides of the Y axis direction across the optical path space K. A plurality of supply pipes 13 and supply passages 14 are provided so as to correspond to a plurality of (two, in the present embodiment) supply ports 12.

As shown in FIG. 3, the nozzle member 6 includes: discharge ports 16 for discharging (exhausting) a gas in the internal space SP to an outer space (an atmosphere space); and discharge passages 15 that connect to the discharge ports 16. The discharge passage 15 is formed by a slit-shaped through-hole that passes through a part of the nozzle member 6. In the present embodiment, the discharge passages 15 are provided respectively on both sides along the X axis direction with respect to the optical path space K (the projection region AR). The upper ends of the discharge passages 15 are connected to the outer space (the atmosphere space), and hence they are open to the atmosphere. On the other hand, the lower ends of the discharge passages 15 are connected to the internal space SP between the final optical element FL and the bottom plate 18. These lower ends of the discharge passages 15 work as the discharge ports 16. The discharge ports 16 are provided, outside the optical path space K of the exposure light EL, respectively at a predetermined position on both sides along the X axis direction with respect to the optical path space K. The discharge ports 16 are connected to the internal space SP, and hence the gas inside the internal space SP, that is, the gas around the image plane of the projection optical system PL can be discharged (exhausted) to the external space ST from the upper ends of the discharge passages 15 via the discharge ports 16. The upper ends of the discharge passages 15 may be connected with a suction apparatus including a vacuum system, and the suction apparatus may be driven to forcefully discharge the gas in the internal space SP.

Inside the nozzle member 6, the recovery passage 24 is formed that connects to the collection port 22. In the nozzle member 6, there is formed a space that opens downward, which makes up the recovery passage 24. The collection port 22 is defined by an opening of the space that opens downward. The recovery passage 24 is provided outside the supply passages 14 and the discharge passages 15 with respect to the optical path space K. The collection port 22 is provided, above the substrate P held in the substrate stage 4, at a position that faces the surface of the substrate P. The surface of the substrate P held in the substrate stage 4 and the collection port 22 provided in the nozzle member 6 are spaced a predetermined distance apart. The collection port 22 is provided outside the supply ports 12 and the discharge ports 16 with respect to the optical path space K on the image plane side of the projection optical system PL. It is formed in an annular shape so as to surround the optical path space K (the projection region AR), the land surface 17, the supply ports 12, and the discharge ports 16. In the present embodiment, the collection port 22 is formed in an annular shape in a planar view. Moreover, the recovery passage 24 is connected to the liquid recovery apparatus 21 via the recovery pipe 23. Therefore, the collection port 22 is connected to the liquid recovery apparatus 21 via the recovery pipe 23 and the recovery passage 24. Note that the collection port 22 may be a single collection port that is continuously formed or may be made of a plurality of collection ports that are intermittently formed.

The nozzle member 6 is arranged so as to cover the collection port 22. It is provided with a porous member 25 that has a plurality of holes. The porous member 25 can be formed of a mesh member made from titanium or a porous body made from ceramics. The porous member 25 has a bottom surface 25B that faces the substrate P held in the substrate stage 4. The bottom surface 25B of the porous member 25 that faces the substrate P is substantially flat. The porous member 25 is provided in the collection port 22 so that the bottom surface 25B thereof is substantially parallel to the surface of the substrate P held in the substrate stage 4 (that is, the XY plane). The liquid LQ is recovered via the porous member 25 provided in the collection port 22. Moreover, the collection port 22 is formed in an annular shape so as to surround the optical path space K. Therefore, the porous member 25 arranged in the collection port 22 is formed in an annular shape so as to surround the optical path space K, correspondingly to the collection port 22. Furthermore, the porous member 25 is provided in the collection port 22 so that the bottom surface 25B thereof and the land surface 17 are at substantially the same position (height) in the Z axis direction, and so that the bottom surface 25B and the land surface 17 are continuous. That is, the land surface 17 and the bottom surface 25B of the porous member 25 are provided substantially flush with each other.

In the present embodiment, the liquid immersion mechanism 1 is provided so as to recover only the liquid LQ via the collection port 22 by optimizing the difference between the pressure of the recovery passage 24 and the pressure of the external space (atmosphere space) ST, according to the diameters of the holes of the porous member 25, the contact angle between the porous member 25 and the liquid LQ, the surface tension of the liquid LQ, and the like. More specifically, the liquid immersion mechanism 1 recovers only the liquid LQ by controlling the suction pressure on the recovery passage 24 by means of the liquid recovery apparatus 21, and optimizing the pressure of the recovery passage 24. Note that the number, positions, and shapes of the supply ports, collection ports, and discharge ports of the nozzle member 6 are not limited to those shown in FIG. 3, but any number, positions, and shapes thereof may be adopted as long as the liquid immersion region LR is favorably maintained. For example, the supply ports 12 may be provided on both sides of the X axis direction, and the discharge ports 16 may be provided on both sides of the Y axis direction.

Next is a description of the method for exposing a pattern image of the mask M onto the substrate P using the exposure apparatus EX with the above configuration.

The control apparatus 7 drives the liquid supply apparatus 11 and the liquid recovery apparatus 21 in order to fill the optical path space K of the exposure light EL with the liquid LQ. The liquid LQ that has been sent from the liquid supply apparatus 11 under the control of the control apparatus 7, after passing through the supply pipes 13, is supplied to the internal space SP between the final optical element FL of the projection optical system PL and the bottom plate 18 from the supply ports 12 via the supply passages 14 of the nozzle member 6. As a result of the liquid LQ supplied to the internal space SP, a gas portion that was present in the internal space SP is discharged to the outside via the discharge ports 16 and/or the opening 18K.

The liquid LQ supplied to the internal space SP flows in the space between the land surface 17 and the substrate P (the substrate stage 4) via the opening 18K, to thereby fill the optical path space K. At this time, the control apparatus 7 is recovering a predetermined amount of the liquid LQ per unit time by use of the liquid recovery apparatus 21. The liquid LQ between the land surface 17 and the substrate P, after flowing in the recovery passage 24 via the collection port 22 of the nozzle member 6 and flowing through the recovery pipe 23, is recovered into the liquid recovery apparatus 21.

The control apparatus 7 controls the liquid immersion mechanism 1 to concurrently perform a liquid supply operation by means of the liquid supply apparatus 11 and a liquid recovery operation by means of the liquid recovery apparatus 21, thereby filling the optical path space K with the liquid LQ to locally form a liquid immersion region LR of the liquid LQ on a region of one portion on the substrate P. The control apparatus 7 then exposes the pattern image of the mask M onto the substrate P via the projection optical system PL and the liquid LQ at the optical path space K while relatively moving the projection optical system PL and the substrate P, in a condition with the optical path space K of the exposure light EL filled with the liquid LQ. The exposure apparatus EX of the present embodiment is a scanning type exposure apparatus with the Y axis direction being its scanning direction. Therefore, the control apparatus 7 controls the substrate stage 4 to move the substrate P in the Y axis direction at a predetermined speed while exposing the substrate P.

Figure 4A:
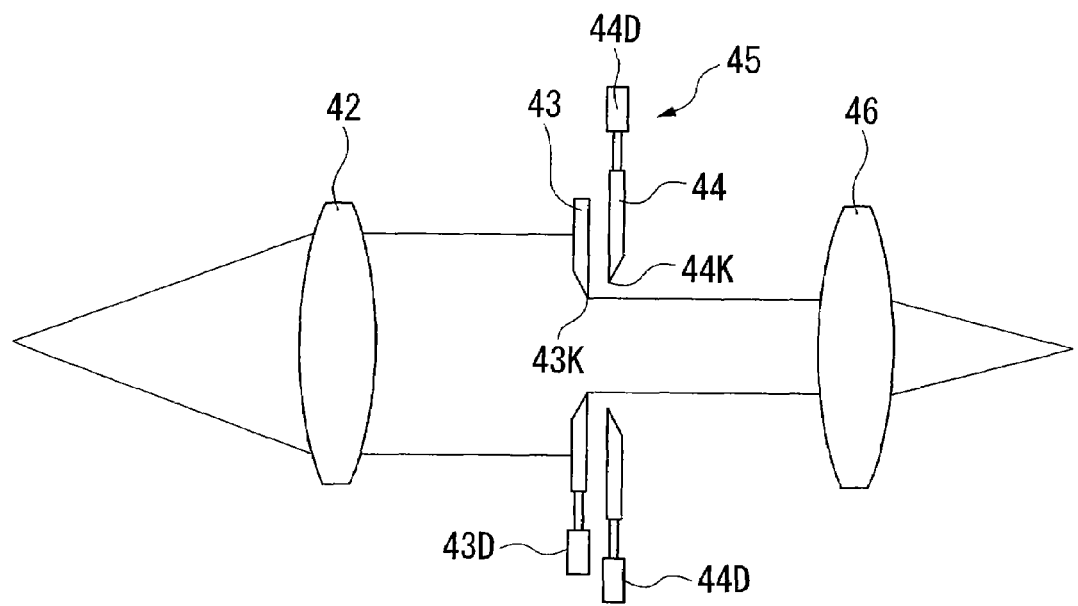
FIG. 4A is a schematic diagram showing a relationship between a setting apparatus and an irradiation region of exposure light in a first state.
Figure 4B:
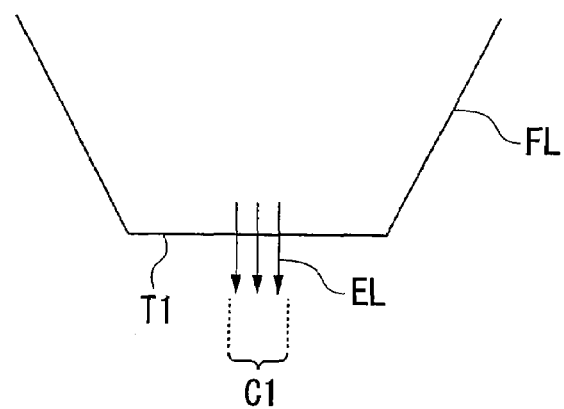
FIG. 4B is another schematic diagram showing a relationship between the setting apparatus and the irradiation region of exposure light in the first state.

When irradiating the exposure light EL onto the substrate P, the control apparatus 7 uses the blind apparatus 45 to set the irradiation region (projection region) AR of the exposure light EL on the substrate P. On the surface of the substrate P, the irradiation region (projection region) AR onto which the exposure light EL is irradiated is set in a slit shape by the blind apparatus 45. That is, as shown in the schematic diagram of FIG. 4A, in a first state in which the exposure light EL is exposed onto the substrate P, the control apparatus 7 uses the blind apparatus 45 to set the irradiation region (illumination region) IA of the exposure light EL on the mask M, and consequently the irradiation region (projection region) AR of the exposure light EL on the substrate P. Moreover, as shown in the schematic diagram of FIG. 4B, in the first state in which the exposure light EL is exposed onto the substrate P, the exposure light EL that has been incident on the upper surface T2 of the final optical element FL and passed through the final optical element FL, passes through a first region C1 of the bottom surface (liquid contact surface) T1, which is contacted with the liquid LQ, of the final optical element FL of the projection optical system PL, the first region C1 corresponding to the irradiation region (projection region) AR. The exposure light EL that has passed through the first region C1 of the bottom surface T1 of the final optical element FL, after passing through the liquid LQ, is irradiated onto the substrate P. In this manner, the exposure light EL is irradiated onto the substrate P via the final optical element FL and the liquid LQ in the optical path space K.

In the present embodiment, the nozzle member 6 has the bottom plate 18 with the land surface 17 that faces the substrate P, and a small gap is formed between the substrate P and the land surface 17 so as to surround the optical path of the exposure light EL. Therefore, the liquid LQ can be favorably maintained between the surface of the substrate P and the land surface 17. As a result, even in the case where the substrate P is moved with respect to the optical path space K filled with the liquid LQ, the liquid LQ can be prevented from flowing out.

As shown in FIG. 2, the substrate P is provided with: a base material W made of a semiconductor wafer or the like; and a first film Rg made of a photosensitive material (photoresist) that covers a surface of the base material W. There is a possibility that impurities (foreign matter) generated from the first film Rg is mixed in the liquid LQ filling the optical path space K. The impurities generated from the photosensitive material include: a fragment of the photosensitive material; and precipitated matter out of an electrolyte included in the photosensitive material. In the case where the photosensitive material is a chemical amplification resist, the impurities generated from the photosensitive material include: a photo acid generator (PAG) included in the base resin; and an amine-based substance called a quencher. Since the photosensitive material includes organic matter, there is a possibility that impurities including organic matter are mixed in the liquid LQ filling the optical path space K. The liquid LQ filling the optical path space K is also contacted with the bottom surface (liquid contact surface) T1 of the final optical element FL. Therefore, there is a possibility that impurities (organic matter) are attached to the bottom surface T1 of the final optical element FL. Even in the case where the substrate P is formed of: the base material W; the first film Rg; and a protection film called a topcoat film that covers the first film Rg, impurities may be generated from the topcoat film in the liquid LQ, impurities may be mixed in the liquid LQ from the photosensitive material (the first film Rg) via the topcoat film, or impurities (organic matter) may be attached to the bottom surface T1 of the final optical element FL.

In the present embodiment, the ArF excimer laser beam, which is ultraviolet light that can induce photochemical cleaning action, is used as the exposure light EL. Therefore, of the bottom surface T1 of the final optical element FL, the first region C1 through which the exposure light EL passes is cleaned by photochemical action. As a result of irradiation of the exposure light EL, which is ultraviolet light, impurities attached to the first region C1 of the bottom surface T1 of the final optical element FL are decomposed by oxidation and removed. That is, the first region C1 of the bottom surface T1 of the final optical element FL is photochemically cleaned by the exposure light EL, in the first state in which the exposure light EL is irradiated onto the substrate P. In this manner, irradiation of the exposure light EL can induce photochemical cleaning action on the first region C1 of the bottom surface T1 of the final optical element FL, and can induce the decomposition reaction of the impurities (the organic matter) attached to the first region C1 of the bottom surface T1 of the final optical element FL. Furthermore, irradiation of the exposure light EL can maintain (or enhance) the lyophilicity of the first region C1 of the bottom surface T1 of the final optical element FL.

In the first state in which the exposure light EL is irradiated onto the substrate P, the control apparatus 7 concurrently supplies and recovers the liquid LQ by use of the liquid supply apparatus 11 and the liquid recovery apparatus 21 of the liquid immersion mechanism 1. In this manner, while supplying and recovering the liquid LQ by use of the liquid supply apparatus 11 and the liquid recovery apparatus 21, foreign matter (impurities) removed from the first region C1 of the bottom surface T1 of the final optical element FL by the photochemical decomposition with irradiation of the exposure light EL can be recovered together with the liquid LQ.

There is also a possibility that impurities (organic matter) are attached to a second region C2 (including at least a part of the remaining portion of the bottom surface T1 other than the first region C1), which is different from the first region C1 through which the exposure light EL passes, of the bottom surface T1 of the final optical element FL. To address this, in the present embodiment, in a second state in which the exposure light EL is not irradiated onto the substrate P, such as when the exposure apparatus EX is under maintenance, the exposure light EL is irradiated onto the second region C2, which is different from the first region C1, of the bottom surface T1 of the final optical element FL to thereby photochemically clean the second region C2.

Figure 5:
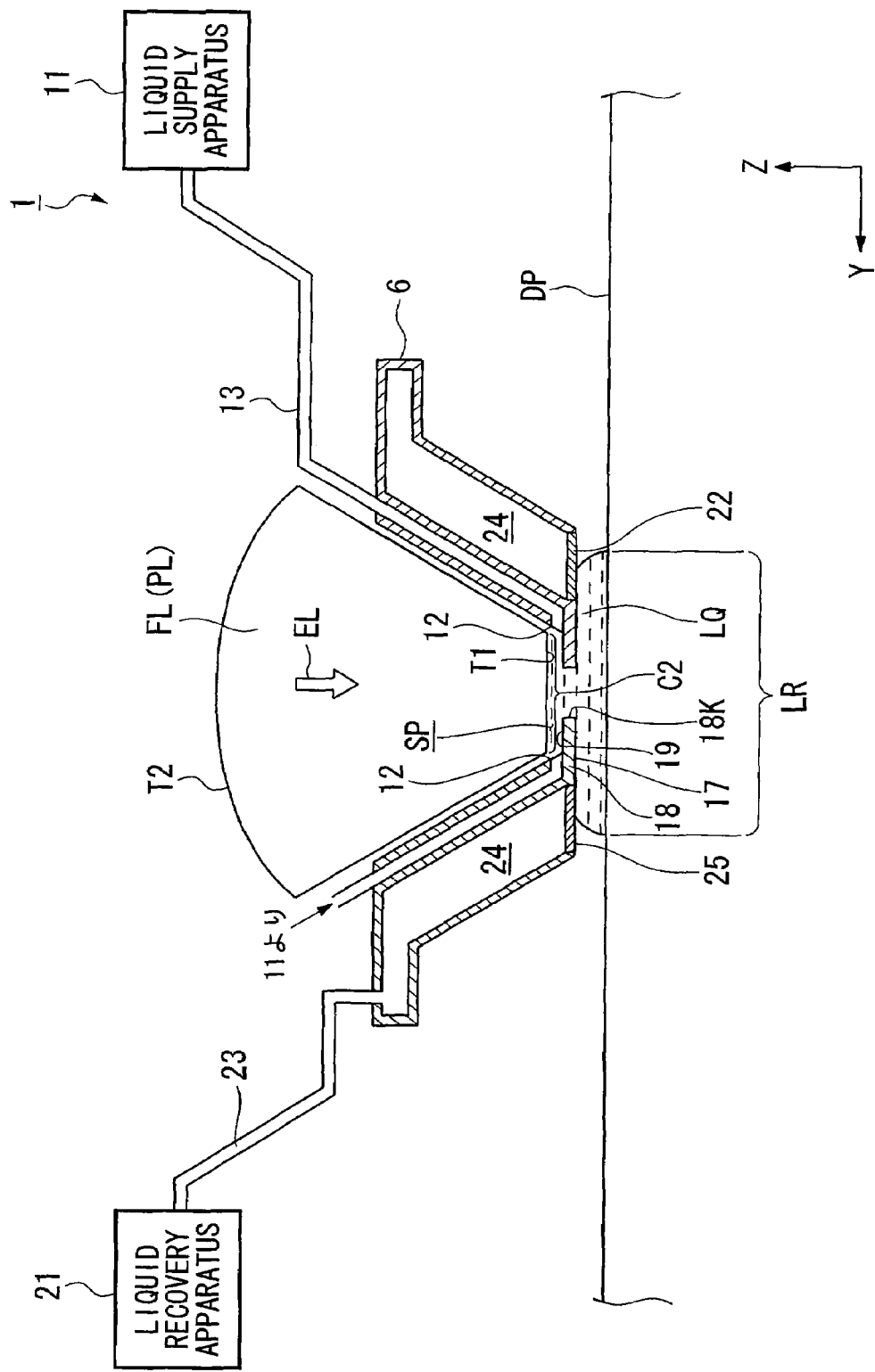
FIG. 5 is a diagram for explaining a maintenance method according to the first embodiment.

FIG. 5 shows a state in which the second region C2 of the bottom surface T1 of the final optical element FL is cleaned by photochemical action. Here, the second region C2 of the bottom surface T1 of the final optical element FL is a region that includes the first region C1 and a region around the first region C1. In the present embodiment, a description will be made assuming that substantially the entire region of the bottom surface T1 of the final optical element FL is the second region C2.

As shown in FIG. 5, when the second region C2 is photochemically cleaned by use of the exposure light EL, a space between the final optical element FL and a predetermined member other than the substrate P is filled with the liquid LQ by the liquid immersion mechanism 1. In the present embodiment, as the predetermined member, a dummy substrate DP that is held in the substrate stage 4 and is different from the substrate P for manufacturing devices is used. The dummy substrate DP has substantially the same shape as that of the substrate P for manufacturing devices, and can be held in the substrate holder 4H of the substrate stage 4. The dummy substrate DP has a liquid-repellent surface that does not allow impurities to be generated in the liquid LQ.

When irradiating the exposure light EL onto the second region C2 to induce photochemical action on the second region C2, the exposure apparatus EX makes the final optical element FL of the projection optical system PL and the dummy substrate DP held in the substrate stage 4 face each other. In this state, the exposure apparatus EX fills a space between the projection optical system PL and the dummy substrate DP with the liquid LQ using the liquid immersion mechanism 1, and forms the liquid immersion region LR of the liquid LQ on the dummy substrate DP.

Figure 6A:
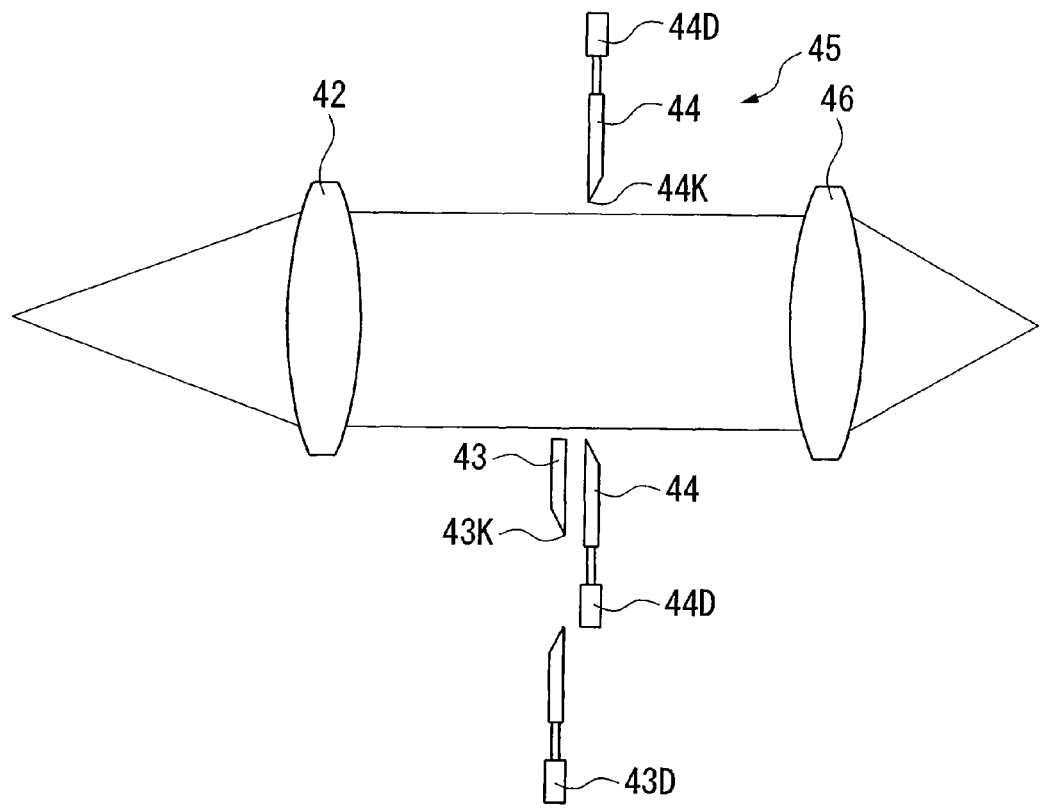
FIG. 6A is a schematic diagram showing a relationship between a setting apparatus and an irradiation region of exposure light in a second state.
Figure 6B:
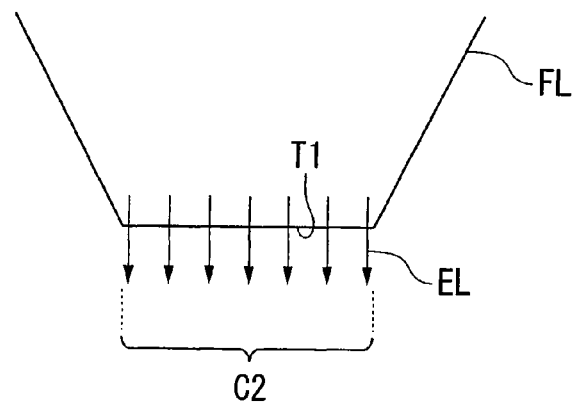
FIG. 6B is another schematic diagram showing a relationship between the setting apparatus and the irradiation region of exposure light in the second state.

The control apparatus 7 drives the blind apparatus 45 in order to induce photochemical action on the second region C2, in a condition with the space between the projection optical system PL and the dummy substrate DP being filled with the liquid LQ. To be more specific, as shown in the schematic diagram of FIG. 6A, in order to irradiate the exposure light EL onto the second region C2, the control apparatus 7 uses the first driving unit 43D to drive the first blind 43 which is provided on the optical path of the exposure light EL, to thereby withdraw the first blind 43 from the optical path of the exposure light EL. Moreover, the control apparatus 7 uses the second driving unit 44D to drive the second blind 44, to thereby adjust the opening 44K. To be more specific, in order to irradiate the exposure light EL onto the second region C2, the control apparatus 7 makes the size of the opening 44K larger than when the exposure light EL is irradiated onto the substrate P. As a result, as shown in the schematic diagram of FIG. 6B, in the second state in which the exposure light EL is not irradiated onto the substrate P, the exposure light EL that has been incident on the upper surface T2 of the final optical element FL is irradiated onto the second region C2 of the bottom surface (liquid contact surface) T1, which is contacted with the liquid LQ, of the final optical element FL of the projection optical system PL.

In this manner, the exposure light EL, which is ultraviolet light that can induce photochemical cleaning action, is irradiated onto the second region C2 of the bottom surface T1 of the final optical element FL, causing impurities (organic matter) attached to the second region C2 of the bottom surface T1 of the final optical element FL to be decomposed by oxidation and removed. Furthermore, irradiation of the exposure light EL can maintain (or enhance) the lyophilicity of the second region C2 of the bottom surface T1 of the final optical element FL.

The exposure light EL that has passed through the second region C2 of the bottom surface T1 of the final optical element FL is irradiated also onto the upper surface 19 of the bottom plate 18 of the nozzle member 6. Therefore, impurities (organic matter) attached to the upper surface 19 of the bottom plate 18 of the nozzle member 6 can be decomposed by oxidation and removed. Furthermore, irradiation of the exposure light EL can maintain (or enhance) the lyophilicity of the upper surface 19 of the bottom plate 18 of the nozzle member 6.

The control apparatus 7, while concurrently supplying and recovering the liquid LQ by use of the liquid supply apparatus 11 and the liquid recovery apparatus 21 of the liquid immersion mechanism 1, irradiates the exposure light EL onto the second region C2. As a result, foreign matter (impurities) removed from the second region C2 of the bottom surface T1 of the final optical element FL by the photochemical decomposition can be recovered together with the liquid LQ.

As described above, irradiation of the exposure light EL onto the second region C2, through which the exposure light EL does not pass when the substrate P is exposed, of the bottom surface T1 of the final optical element FL can remove impurities (organic matter) attached to the second region C2 other than the first region C1 by photochemical decomposition. Consequently, the occurrence of the inconveniences such as decrease in transmittance in the bottom surface T1 of the final optical element FL and change in imaging characteristics of the projection optical system PL can be prevented, and hence a deterioration of the performance of the exposure apparatus EX can be suppressed. In this manner, in the present embodiment, a deterioration of the performance of the exposure apparatus EX resulting from pollution of an optical member that is contacted with the liquid LQ for filling the optical path space K of the exposure light EL can be prevented.

Furthermore, irradiation of the exposure light EL can maintain the lyophilicity of the bottom surface T1 of the final optical element FL. Consequently, the bottom surface T1 of the final optical element FL can be in close contact with the liquid LQ, and hence a liquid immersion region LR with a desired state can be formed while suppressing mixing of bubbles or the like therein.

Furthermore, irradiation of the exposure light EL that has passed through the second region C2 of the bottom surface T1 of the final optical element FL onto the upper surface 19 of the bottom plate 18 of the nozzle member 6 can remove impurities attached to the upper surface 19 of the bottom plate 18 and also can maintain the lyophilicity of the upper surface 19 of the bottom plate 18.

In the present embodiment, in order to favorably form the liquid immersion region LR, the bottom plate 18 with the land surface 17 is provided in the nozzle member 6, and the internal space SP with a predetermined gap is formed between the bottom surface T1 of the final optical element FL and the bottom plate 18. However, in the case where the liquid LQ including impurities finds its way into the internal space SP, the density of the impurities in the liquid LQ in the internal space SP may increase depending on how the liquid flows, making it likely that the impurities are attached to the bottom surface T1 of the final optical element FL and to the upper surface 19 of the bottom plate 18.

In the case where the lyophilicity of the bottom surface T1 of the final optical element FL is deteriorated (in the case where the bottom surface T1 has become liquid-repellent) due to attachment of impurities or the like, the closeness of contact between the bottom surface T1 of the final optical element FL and the liquid LQ may decrease, making it likely that bubbles (gas portions) are generated in the liquid LQ that fills the optical path space K, or that bubbles are attached to the bottom surface T1 of the final optical element FL. Furthermore, there is a possibility of occurrence of an unfavorable situation where the bubbles attached to a region of the bottom surface T1 of the final optical element FL other than the first region C1 are detached from the final optical element FL during exposure of the substrate P and are arranged in the optical path of the exposure light EL.

Similarly, in the case where the lyophilicity of the upper surface 19 of the bottom plate 18 is deteriorated, there is also a possibility of occurrence of unfavorable situations such as where bubbles (gas portions) are likely to be generated in the liquid LQ that fills the optical path space K, where bubbles are likely to be attached to the upper surface 19 of the bottom plate 18, and where the bubbles attached to the upper surface 19 of the bottom plate 18 are detached from the upper surface 19 of the bottom plate 18 during exposure of the substrate P and are arranged on the optical path of the exposure light EL.

In the present embodiment, in maintenance or the like, light (exposure light) that can induce photochemical cleaning action is irradiated onto the second region C2 of the bottom surface T1 of the final optical element FL onto which the exposure light EL does not irradiate during exposure of the substrate P, and onto the upper surface 19 of the bottom plate 18 to induce photochemical action on the second region C2 and the upper surface 19 of the bottom plate 18. Thereby, impurities (organic matter) attached to the bottom surface T1 of the final optical element FL and the upper surface 19 of the bottom plate 18 can be removed and the lyophilicity of the bottom surface T1 of the final optical element FL and the upper surface 19 of the bottom plate 18 can be maintained.

Consequently, the closeness of contact between the bottom surface T1 of the final optical element FL and the liquid LQ can be maintained and occurrence of unfavorable situations can be prevented such as where bubbles are generated in the liquid LQ or where bubbles are attached to the bottom surface T1. Similarly, occurrence of other unfavorable situations can be prevented such as bubbles are attached to the upper surface 19 of the bottom plate 18.

Furthermore, it is configured such that in order to photochemically clean the second region C2 of the bottom surface T1 of the final optical element FL, the exposure light EL that has been incident on the upper surface T2 of the final optical element FL and passed through the final optical element FL is irradiated onto the second region C2. Therefore, the second region C2 can be smoothly cleaned by photochemical action. Furthermore, the exposure light EL can be smoothly irradiated also onto the upper surface 19 of the bottom plate 18 that faces the bottom surface T1 of the final optical element FL.

Moreover, by driving the blind apparatus 45 that is provided on the optical path of the exposure light EL and is capable of adjusting the irradiation region (the projection region) AR of the exposure light EL on the substrate P, the exposure apparatus EX can smoothly irradiate the exposure light EL onto the second region C2 of the bottom surface T1 of the final optical element FL, and can photochemically clean the second region C2 with smoothness by use of the existing apparatuses and members.

The photochemical cleaning process for the second region C2 of the bottom surface T1 of the final optical element FL by irradiating the exposure light EL onto the second region C2 can be performed at predetermined periodic intervals such as in maintenance. Alternatively, if a contamination state of the second region C2 (an amount of decrease in transmittance on the bottom surface T1) according to the types (the materiality) of the photosensitive material and/or the contact time between the substrate P and the liquid LQ, or the like can be acquired beforehand by experiment or simulation, the operation of irradiating the exposure light EL onto the second region C2 may be performed according to the acquired contamination state. Alternatively, the contamination state of the second region C2 may be measured by means of a measurement apparatus that is capable of measuring the contamination state of the second region C2, and when the contamination state goes beyond a tolerance range based on the measurement result, the exposure light EL may be irradiated onto the second region C2.

<Second Embodiment>

Figure 7A:
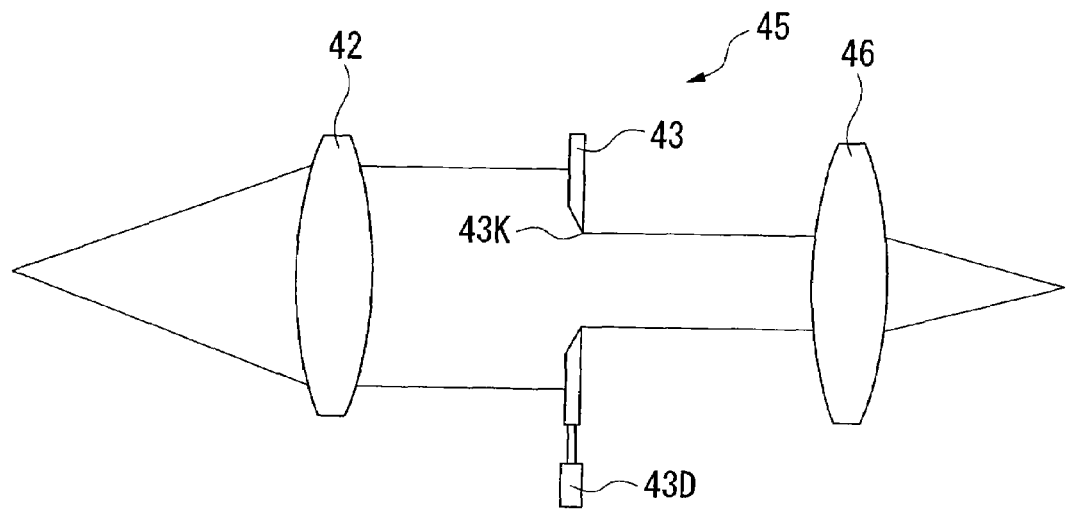
FIG. 7A is a schematic diagram showing a setting apparatus according to a second embodiment.
Figure 7B:
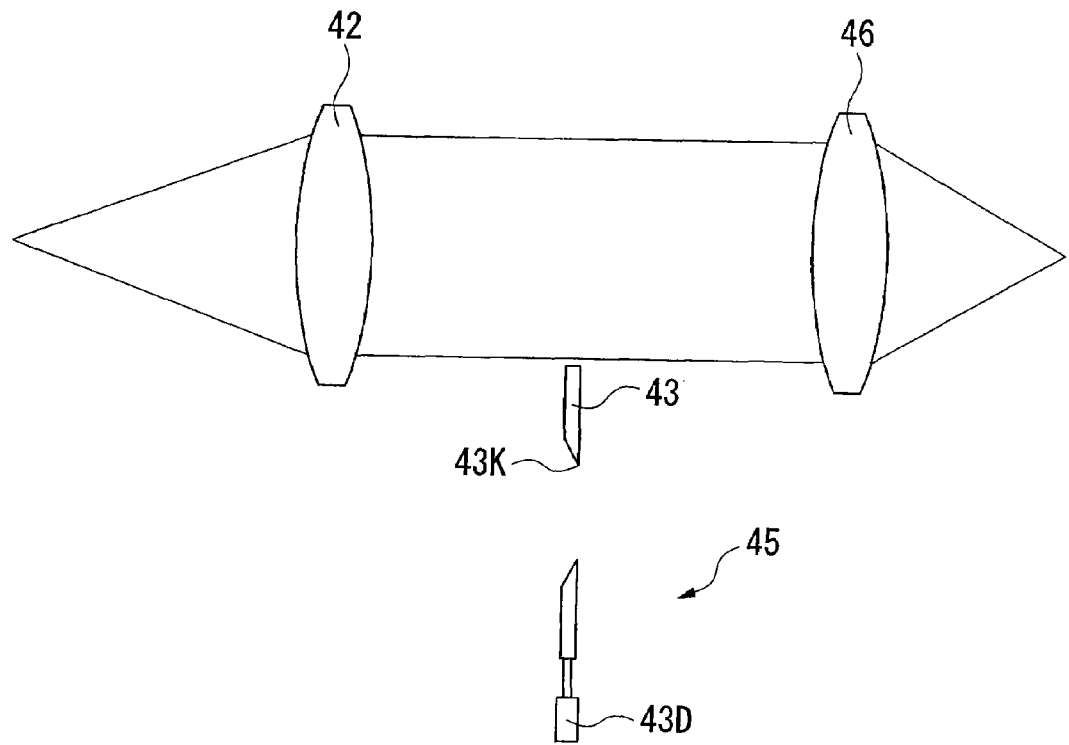
FIG. 7B is another schematic diagram showing the setting apparatus according to the second embodiment.

Next is a description of a second embodiment with reference to FIG. 7A and FIG. 7B. In the following description, components the same as or similar to those of the abovementioned embodiment are denoted by the same reference symbols, and description thereof is simplified or omitted.

As shown in FIG. 7A, a blind apparatus 45 for setting an irradiation region (IA, AR) of exposure light EL may have only a first blind 43. The blind apparatus 45 has: a first blind 43 which is provided on an optical path of the exposure light EL for forming an opening 43K for setting the irradiation region; and a driving unit 43D for driving the first blind 43. In order to irradiate the exposure light EL onto a second region C2, a control apparatus 7 drives the first blind 43 by use of the driving unit 43D to withdraw the first blind 43 from the optical path of the exposure light EL, as shown in FIG. 7B. As a result, the exposure light EL is irradiated onto the second region C2 of the bottom surface T1 of the final optical element FL.

<Third Embodiment>

Figure 8A:
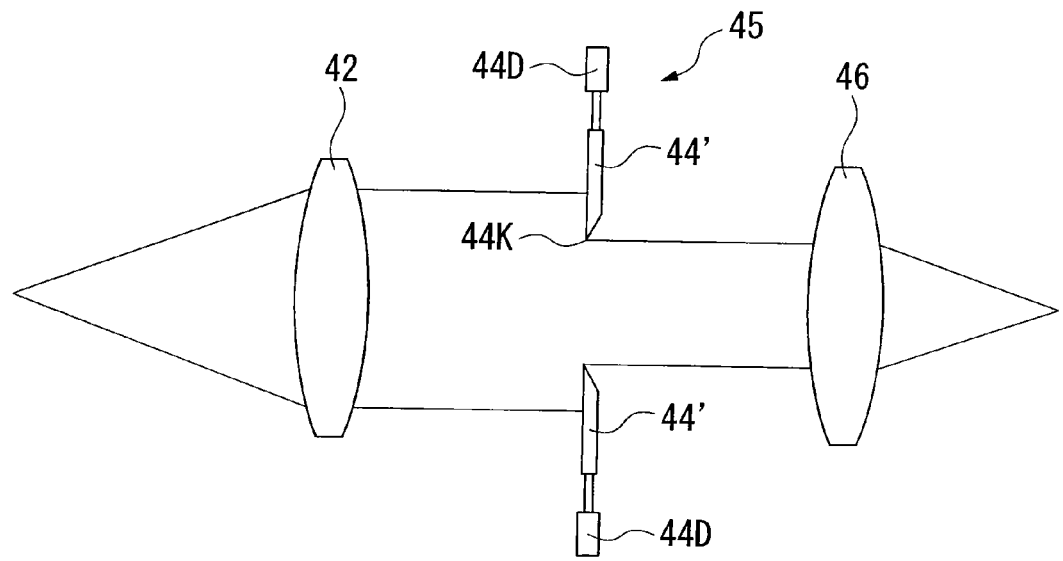
FIG. 8A is a schematic diagram showing a setting apparatus according to a third embodiment.
Figure 8B:
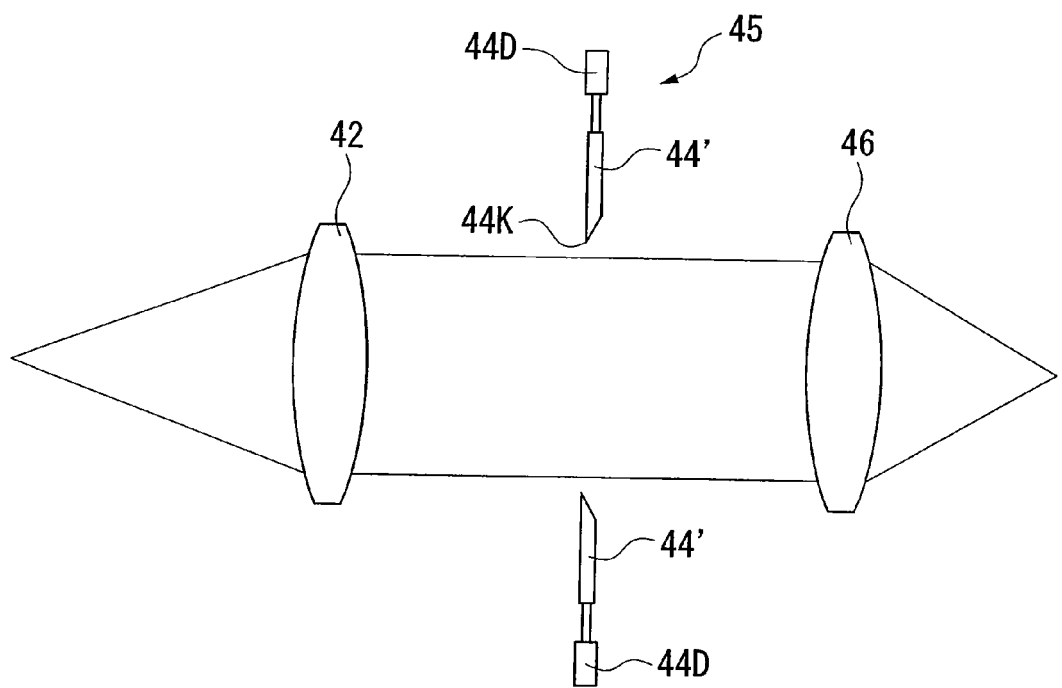
FIG. 8B is another schematic diagram showing the setting apparatus according to the third embodiment.

Next is a description of a third embodiment with reference to FIG. 8A and FIG. 8B. In the following description, components the same as or similar to those of the abovementioned embodiments are denoted by the same reference symbols, and description thereof is simplified or omitted. In FIG. 8A, the blind apparatus 45 includes: a second blind 44' which is provided on an optical path of exposure light EL for forming an opening 44K for setting an irradiation region (IA, AR); and a driving unit 44D that is capable of adjusting the size of the opening 44K. The second blind 44' is made of a plurality of combined plate-shaped members. It is capable of adjusting the opening 44K, and consequently the irradiation region, by driving each of the plate-shaped members. In order to irradiate the exposure light EL onto a second region C2, the control apparatus 7 drives the plate-shaped members of the second blind 44' by use of the driving unit 44D to make the opening 44K larger, as shown in FIG. 8B. As a result, the exposure light EL is irradiated onto the second region C2 of the bottom surface T1 of the final optical element FL.

<Fourth Embodiment>

Next is a description of a fourth embodiment with reference to FIG. 9. In the following description, components the same as or similar to those of the abovementioned embodiments are denoted by the same reference symbols, and description thereof is simplified or omitted. As shown in FIG. 9, when exposure light EL is irradiated onto a second region C2 of a bottom surface T1 of a final optical element FL, the final optical element FL and an upper surface 4F of a substrate stage 4 are made to face each other, and then in a condition with the space between the final optical element FL and the upper surface 4F of the substrate stage 4 being filled with a liquid LQ, the exposure light EL can be irradiated onto the second region C2. In this case, on the upper surface 4F of the substrate stage 4, there is provided a predetermined region in which impurities are not allowed to be mixed and the surface state of which does not change by irradiation of the exposure light EL. The liquid LQ is filled between the final optical element FL and the predetermined region. Note that the predetermined region the surface state of which does not change by irradiation of the exposure light EL includes a region, of the upper surface 4F, whose liquid-repellency does not deteriorate.

<Fifth Embodiment>

Figure 10:
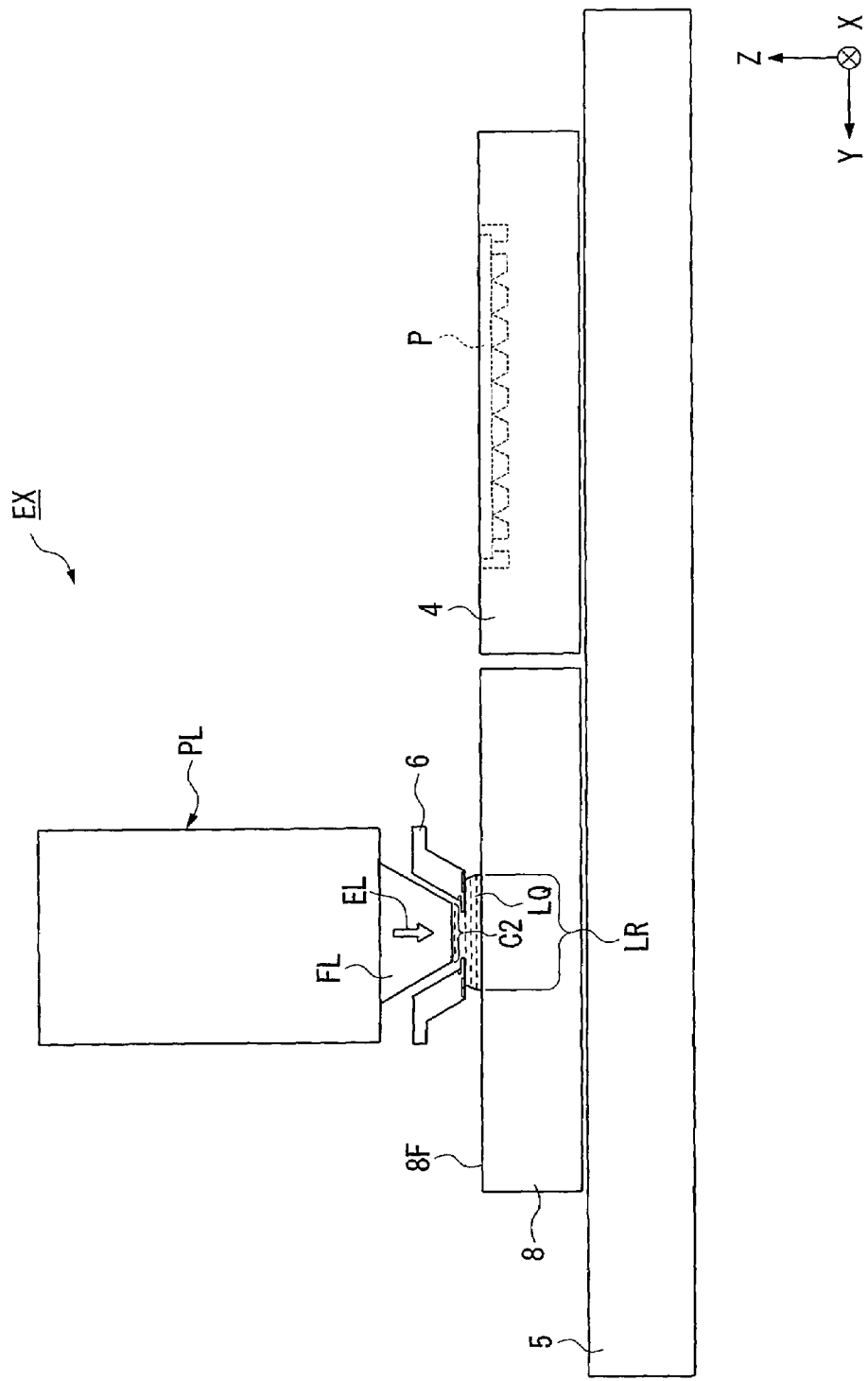
FIG. 10 is a diagram for explaining a maintenance method according to a fifth embodiment.

Next is a description of a fifth embodiment with reference to FIG. 10. In the following description, components the same as or similar to those of the abovementioned embodiments are denoted by the same reference symbols, and description thereof is simplified or omitted. The exposure apparatus EX shown in FIG. 10 includes: a substrate stage 4 that is capable of holding and moving a substrate P; and a measurement stage 8 that is capable of moving while measurement equipment for performing a measurement related to an exposure process is mounted thereon, the measurement equipment including a reference member formed with a reference mark, and various photoelectronic sensors, as disclosed for example in Japanese Patent Application, Publication No. H11-135400 (corresponding to PCT International Publication No. WO 1999/23692), and Japanese Patent Application, Publication No. 2000-164504 (corresponding to U.S. Pat. No. 6,897,963).

As shown in FIG. 10, when exposure light EL is irradiated onto a second region C2 of a final optical element FL, the final optical element FL and an upper surface 8F of a measurement stage 8 are made to face each other, and then in a condition with a space between the final optical element FL and the upper surface 8F of the measurement stage 8 being filled with a liquid LQ, the exposure light EL can be irradiated onto the second region C2. In this case, on the upper surface 8F of the measurement stage 8, there is provided a region, other than the area on which the measurement equipment is mounted, in which impurities are not allowed to be mixed into the liquid LQ and the surface state of which does not change by irradiation of the exposure light EL. The liquid LQ is filled between the final optical element FL and the region.

In the above embodiments, the exposure light EL is irradiated onto the second region C2 of the bottom surface T1 of the final optical element FL while the liquid LQ is concurrently supplied and recovered using the liquid immersion mechanism 1. However, after the space between the final optical element FL and the predetermined member is filled with the liquid LQ, the exposure light EL may be irradiated onto the second region C2 in a condition with the supply operation and recovery operation of the liquid LQ stopped.

When the exposure light EL is irradiated onto the second region C2, the intensity (illuminance) of the exposure light EL on the bottom surface T1 of the final optical element FL may be changed in comparison with when the exposure light EL is irradiated onto the substrate P. For example, making the illuminance when the exposure light EL is irradiated onto the second region C2 larger than that when the exposure light EL is irradiated onto the substrate P can more favorably remove the impurities attached to the bottom surface T1. In the case where irradiation of the exposure light EL brings about a deterioration in the final optical element FL or the various optical members provided on the optical path of the exposure light EL, the intensity (illuminance) of the exposure light EL to be irradiated can be appropriately adjusted.

The nozzle member 6 of the above embodiments is provided with the bottom plate 18 with the upper surface 19 that faces the bottom surface T1 of the final optical element FL. However, it is obvious that the present invention is applicable also to an exposure apparatus EX that has a nozzle member 6 without a bottom plate 18. That is, the configuration of the liquid immersion mechanism 1 including the nozzle member 6 is not limited to the configuration mentioned above. A liquid immersion mechanism (a nozzle member) may be used as disclosed for example in European Patent Publication No. EP 1,420,298, PCT International Publication No. WO 2004/055803, PCT International Publication No. WO 2004/057590, PCT International Publication No. WO 2005/029559, PCT International Publication No. WO 2004/086468 (corresponding to U.S. Patent Application, Publication No. 2005/0280791A1), Japanese Patent Application, Publication No. 2004-289126 (corresponding to U.S. Pat. No. 6,952,253), etc. Furthermore, the exposure apparatus EX does not need to be provided with at least a part (for example, a member that constitutes the liquid supply apparatus 11 and/or the liquid recovery apparatus 21) of the liquid immersion mechanism 1. It may be substituted for equipment of, for example, a factory in which the exposure apparatus EX is installed.

In the above embodiments, the liquid LQ which is used when the substrate P is immersion exposed is subjected to a degassing treatment before it is supplied to the image plane side of the projection optical system PL with a view to preventing bubbles from being generated in the liquid immersion region LR or the like. That is, the liquid supply apparatus 11 is provided with a degassifier for decreasing the dissolved oxygen (the dissolved gas) in the liquid LQ. After performing a degassing treatment on the liquid LQ that is not supplied yet to the image plane side of the projection optical system PL, the liquid supply apparatus 11 supplies the degassed liquid LQ to the image plane side of the projection optical system PL. On the other hand, since photochemical cleaning process induces decomposition reaction of impurities (organic matter) by oxidation as a result of irradiation of light that can induce photochemical cleaning action, it is preferable in the photochemical cleaning process that there be a predetermined concentration of oxygen present (dissolved) in the liquid LQ. Therefore, when in the photochemical cleaning process for the second region C2 of the final optical element FL, the upper surface 19 of the bottom plate 18, and the like by irradiating the exposure light EL onto the second region C2 of the final optical element FL in a condition with the space between the final optical element FL and the predetermined member being filled with the liquid LQ, the control apparatus 7 may make the oxygen concentration of the liquid LQ to be supplied to the image plane side of the projection optical system PL higher than that of the liquid LQ when the substrate P is exposed. That is, in the photochemical cleaning process, the control apparatus 7 may supply, for example, the liquid LQ that is not subjected to a degassing treatment to the image plane side of the projection optical system PL. Alternatively, when in the photochemical cleaning process by irradiating the exposure light EL onto the second region C2 in a condition with the space between the final optical element FL and the predetermined member being filled with the liquid LQ, the control apparatus 7 may supply a liquid other than the liquid (pure water) used for exposure of the substrate P, for example hydrogen peroxide, to the image plane side of the projection optical system PL.

In the above embodiments, the position(s) of the blind(s) (43 and/or 44) of the blind apparatus 45 is(are) adjusted so that the exposure light EL is irradiated onto the second region C2 of the bottom surface T1 of the final optical element FL and/or the upper surface 19 of the bottom plate 18. However, the irradiation region of the exposure light EL may be adjusted (enlarged and/or reduced) using an optical element arranged on the optical path of the exposure light EL. In this case, an optical element already arranged on the optical path of the exposure light EL may be used, or the optical element may be arranged on the optical path of the exposure light EL just before the aforementioned photochemical cleaning process is performed.

Photochemical cleaning process may be performed using the blind apparatus 45 together with this optical element. As this optical element, a zoom lens system or a beam expander may be used, for example. In the above embodiments, the second region C2 onto which the exposure light EL is irradiated in photochemical cleaning process includes the first region C1 onto which the exposure light EL is irradiated in exposure. However, the configuration is not limited thereto. The second region C2 does not need to include at least a part of the first region C1. In short, the second region C2 only needs to include at least a part of the remaining portion of the bottom surface T1 other than the first region C1. Moreover, in the above embodiments, photochemical cleaning process is performed using the exposure light EL. However, photochemical cleaning process may be performed using light other than exposure light.

As described above, the liquid LQ of the above embodiments is pure water. Pure water has advantages in that it can be easily obtained in large quantity at semiconductor manufacturing plants, etc. and in that it has little adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned.

In addition, the index of refraction n of pure water (water) with respect to exposure light EL with a wavelength of 193 nm is said to be nearly 1.44, so in the case where ArF excimer laser light (wavelength: 193 nm) is used as the light source of the exposure light EL, it is possible to shorten the wavelength to 1/n, that is, approximately 134 nm on the substrate P, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In the above embodiments, an optical element FL is attached to the front end of the projection optical system PL, and this optical element FL can be used to adjust the optical characteristics, for example, the aberration (spherical aberration, coma aberration, etc.), of the projection optical system PL. Note that an optical plate used for the adjustment of the optical characteristics of the projection optical system PL may also be used as the optical element attached to the front end of the projection optical system PL. Or, it may also be a plane-parallel plate through which the exposure light EL is able to pass.

In the case where the pressure between the substrate P and the optical element of the tip end of the projection optical system PL arising from the flow of the liquid LQ is large, it is permissible to make that optical element not one that is replaceable but one that is firmly secured so that the optical element does not move due to that pressure.

In the above embodiments, the configuration is one in which a liquid LQ is filled between the projection optical system PL and the surface of the substrate P, but it may also be a configuration in which the liquid LQ is filled in a status in which a cover glass consisting of a plane-parallel plate is attached to the surface of the substrate P, for example.

Furthermore, in the projection optical system of the above embodiments, the optical path space on the image plane (exit surface) side of the optical element FL at the front end is filled with a liquid, but a projection optical system, as disclosed in PCT International Publication No. WO 2004/019128, in which the optical path space on the object plane (entrance surface) side of the optical element at the front end is also filled with a liquid, may be adopted.

Note that the liquid LQ of the above embodiments is water (pure water), but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In this case, the part to be in contact with the liquid LQ is applied with lyophilic treatment by forming a thin film using a substance with a molecular structure that has a small polarity including fluorine. In addition, it is also possible to use, as the liquid LQ, liquids that have the transmittance with respect to the exposure light EL and whose refractive index are as high as possible and that are stable with respect to the photoresist coated on the projection optical system PL and the surface of the substrate P (for example, cedar oil).

Moreover as the liquid LQ, a liquid with a refractive index of 1.6 to 1.8 may be used. Furthermore, the optical element FL may be formed from a material with a higher refractive index than that of quartz and fluorite (for example, above 1.6). For the liquid LQ, various liquids, for example a supercritical liquid, can be used.

In the above embodiments, the irradiation region (IA, AR) of the exposure light EL is of a rectangular shape. However, the shape is not limited thereto. It may be of an arc shape. Moreover, the irradiation region (IA, AR) is defined to include the optical axis within the field of vision of the projection optical system PL. However, the configuration is not limited thereto. It may be defined to be decentered without including the optical axis. Furthermore, in the abovementioned embodiments, respective position information for the mask stage 3 and the substrate stage 4 is measured using an interference system (3L, 4L). However the invention is not limited to this and for example, an encoder system which detects a scale (grating) provided in each stage may be used. In this case, preferably a hybrid system is furnished with both of an interference system and an encoder system, and calibration of the measurement results of the encoder system is performed using the measurement results of the interference system. Moreover, position control of the stage may be performed using the interference system and the encoder system interchangeably, or using both.

It is to be noted that as for the substrate P of the above embodiments, not only a semiconductor wafer for manufacturing a semiconductor device, but also a glass substrate for a display device, a ceramic wafer for a thin film magnetic head, or a master mask or reticle (synthetic quartz or silicon wafer), etc. can be used.

As for the exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Moreover, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As the stitch type exposure apparatus, a step-and-stitch type exposure apparatus in which at least two patterns are transferred onto the substrate P in a partially overlapping manner, and the substrate P is sequentially moved can be used.

Furthermore, the present invention can also be applied to a twin stage type exposure apparatus furnished with a plurality of substrate stages, as disclosed for example in Japanese Patent Application, Publication No. H10-163099, Japanese Patent Application, Publication No. H10-214783 (corresponding to U.S. Pat. No. 6,590,634), Published Japanese Translation No. 2000-505958 of PCT International Application (corresponding to U.S. Pat. No. 5,969,441), and U.S. Pat. No. 6,208,407.

Furthermore, the present invention can also be applied to an exposure apparatus furnished with a plurality of substrate stages and a plurality of measurement stages.

Furthermore, in the above embodiments, an exposure apparatus in which the liquid is locally filled in the space between the projection optical system PL and the substrate P is used. However, the present invention can be also applied to a liquid immersion exposure apparatus in which exposure is performed in a condition with the whole surface of the target exposure substrate immersed in a liquid, as disclosed for example in Japanese Patent Application, Publication No. H06-124873, Japanese Patent Application, Publication No. H10-303114, and U.S. Pat. No. 5,825,043.

Moreover, in the above embodiments, an exposure apparatus furnished with a projection optical system PL was described as an example. However, the present invention can also be applied to an exposure apparatus and an exposure method which does not use a projection optical system PL. Even in the case where a projection optical system is not used, the exposure light can be irradiated onto the substrate via optical members such as a mask and a diffractive optical element, and a liquid immersion region can be formed in a predetermined space between these optical elements and the substrate.

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup devices (CCDs), micro machines, MEMS, DNA chips, and reticles or masks.

In the abovementioned embodiments, an optical transmission type mask formed with a predetermined shielding pattern (or phase pattern or dimming pattern) on an optical transmission substrate is used. However instead of this mask, for example as disclosed in U.S. Pat. No. 6,778,257, an electronic mask (called a variable form mask; for example this includes a DMD (Digital Micro-mirror Device) as one type of non-radiative type image display apparatus (space light modulator)) for forming a transmission pattern or reflection pattern, or a light emitting pattern, based on electronic data of a pattern to be exposed may be used.

Furthermore the present invention can also be applied to an exposure apparatus (lithography system) which exposes a line-and-space pattern on a substrate P by forming interference fringes on the substrate P, as disclosed for example in PCT International Publication No. WO 2001/035168.

Moreover, the present invention can also be applied to an exposure apparatus as disclosed for example in Published Japanese Translation No. 2004-519850 of PCT International Application (corresponding U.S. Pat. No. 6,611,316), which combines patterns of two masks on a substrate via a projection optical system, and double exposes a single shot region on the substrate at substantially the same time, using a single scan exposure light.

As far as is permitted by the law of the countries specified or selected in this patent application, the disclosures in all of the Japanese Patent Publications and U.S. patents related to exposure apparatuses and the like cited in the above respective embodiments and modified examples, are incorporated herein by reference.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 11:
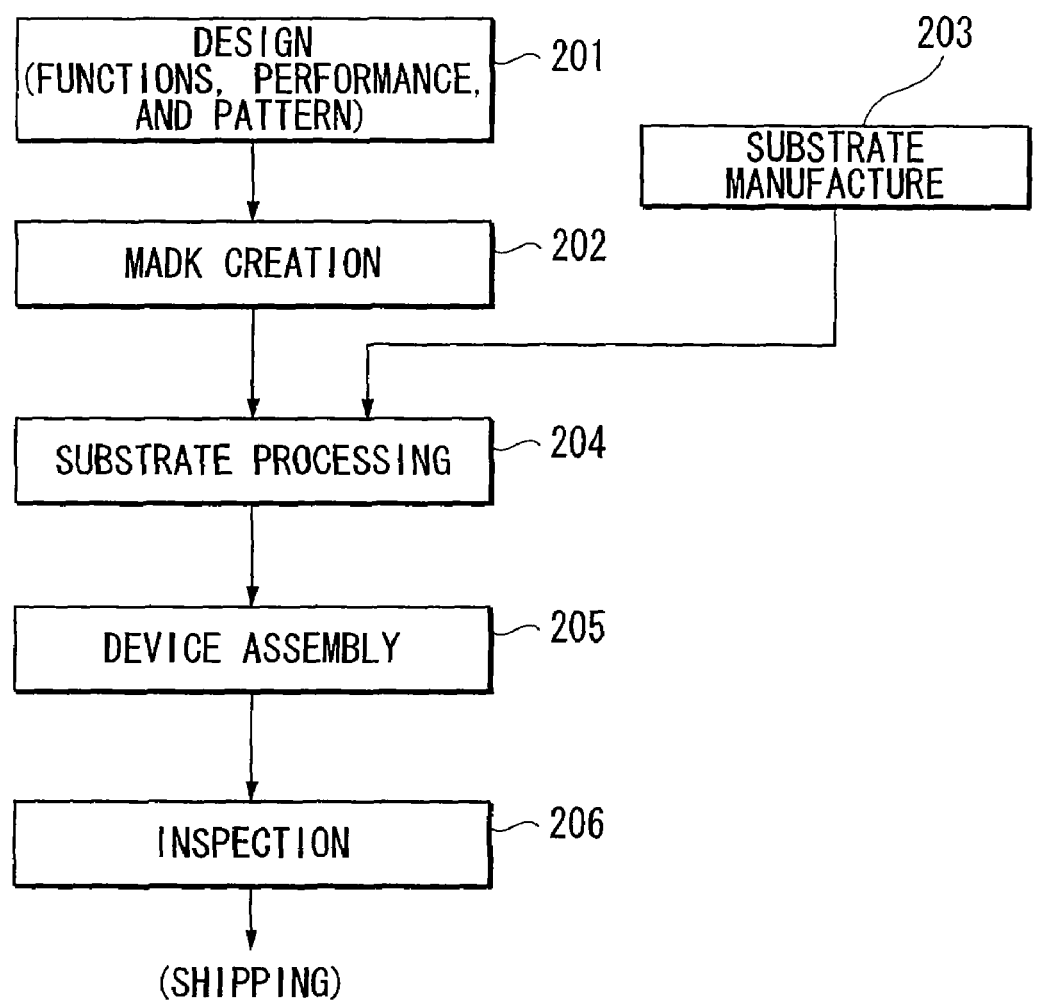
FIG. 11 is a flow chart for explaining an example of manufacturing steps for a micro device.

As shown in FIG. 11, microdevices such as semiconductor devices are manufactured by going through: a step 201 that performs microdevice function and performance design, a step 202 that creates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing) and etching the developed substrate, a device assembly step (including treatment processes such as a dicing process, a bonding process and a packaging process) 205, and an inspection step 206, and so on.

Industrial Applicability

According to the present invention, while a deterioration in performance of an exposure apparatus is prevented, a substrate can be favorably exposed, and a device with desired performance can be manufactured. Consequently, the present invention will contribute to development of a high-tech industry including a semiconductor industry and IT technology of our country.

The invention claimed is:

1. A liquid immersion exposure apparatus, comprising:
    an optical member;
    a liquid immersion member which retains a liquid in a space between the optical member and an object which is movable relative to the optical member, the liquid immersion member having a first surface facing the optical member;
    a light beam source which irradiates a light beam;
    a light beam setting portion which controls the light beam such that the first surface of the liquid immersion member is irradiated with the light beam; and
    a controller which performs removing a foreign matter attached to the first surface of the liquid immersion member by controlling the light beam setting portion to irradiate the first surface of the liquid immersion member with the light beam.

2. The liquid immersion exposure apparatus according to claim 1,
    wherein the first surface of the liquid immersion member is irradiated with the light beam while the liquid immersion member retains the liquid exposure apparatus according to claim 1,
    wherein the liquid immersion member also supplies a liquid to a second space between the first surface of the liquid immersion member and the optical member.

3. The liquid immersion exposure apparatus according to claim 2,
    wherein a predetermined concentration of gas is dissolved in the liquid.

4. The liquid immersion exposure apparatus according to claim 3,
    wherein the gas includes oxygen.

5. The liquid immersion exposure apparatus according to claim 1,
    wherein the liquid immersion member includes a liquid supply member which supplies the liquid to the space.

6. The liquid immersion exposure apparatus according to claim 5,
    wherein the liquid immersion member further comprises a liquid recovery member which recovers the liquid supplied in the space.

7. The liquid immersion exposure apparatus according to claim 1,
    wherein the liquid immersion member includes a nozzle member which has a supplying port to supply the liquid to the space, and has a recovering port to recover a liquid from the space,
    wherein the first surface includes a surface of the nozzle member facing to the optical member.

8. The liquid immersion exposure apparatus according to claim 1,
    wherein the first surface of the liquid immersion member is irradiated with the light beam via a second region of the optical member, which is different from a first region through which the light beam passes when a substrate conveyed from the outside is exposed.

9. The liquid immersion exposure apparatus according to claim 8,
    wherein an intensity of the light beam via the second region of the optical member is different from an intensity of the light beam via the first region of the optical member.

10. The liquid immersion exposure apparatus according to claim 1,
    wherein the object includes any one of a substrate, a dummy substrate and a substrate stage to hold the substrate or the dummy substrate.

11. The liquid immersion exposure apparatus according to claim 8,
    wherein the light beam passes through the second region of the optical member when the first surface of the liquid immersion member is irradiated.

12. The liquid immersion exposure apparatus according to claim 1,
    wherein the first surface of the liquid immersion member is irradiated such that impurities attached to the first surface are decomposed and removed.

13. The liquid immersion exposure apparatus according to claim 1,
    wherein the light beam includes ultraviolet light.

14. The liquid immersion exposure apparatus according to claim 1,
    wherein the light beam setting portion changes an irradiation region of the light beam such that the first surface of the liquid immersion member is irradiated.

15. The liquid immersion
    wherein the liquid immersion member retains the liquid while the first surface of the liquid immersion member is irradiated with the light beam.

16. The liquid immersion exposure apparatus according to claim 1,
    wherein the liquid immersion member has a second surface that is different from the first surface and that faces the object,
    wherein a part of the second surface is disposed between the optical member and the object.

17. The liquid immersion exposure apparatus according to claim 1,
    wherein the first surface of the liquid immersion member surrounds the optical member.

18. A method executed in a liquid immersion exposure apparatus which has an optical member and a liquid immersion member which has a first surface facing the optical member, comprising:
    irradiating a substrate conveyed from the outside with a light beam via a liquid;
    changing an irradiation region of the light beam such that the first surface of the liquid immersion member is irradiated; and
    removing a foreign matter attached to the first surface of the liquid immersion member by irradiating the first surface of the liquid immersion member with the light beam.

19. The method according to claim 18,
    in the space between the optical member and the object.

20. The method according to claim 19,
    wherein a predetermined concentration of gas is dissolved in the liquid.

21. The method according to claim 20,
    wherein the gas includes oxygen.

22. The method according to claim 18,
wherein the first surface of the liquid immersion member is irradiated with the light beam at a second region of the optical member, which is different from a first region through which the light beam passes when the substrate is exposed.

23. The method according to claim 22,
wherein the first surface of the liquid immersion member faces the second region of the optical member.

24. The method according to claim 22,
wherein an intensity of the light beam passing through the second region of the optical member is different from an intensity of the light beam passing through the first region of the optical member.

25. The method according to claim 18,
wherein the object includes any one of the substrate, a dummy substrate and a substrate stage which holds the substrate or the dummy substrate.

26. The method according to claim 18,
wherein the first surface of the liquid immersion member is irradiated such that impurities attached to the first surface are decomposed and removed.

27. The method according to claim 18,
wherein the light beam includes ultraviolet light.

28. The method according to claim 18,
wherein the liquid immersion member has a second surface that is different from the first surface and that faces the object.

* * * * *

UNITED STATES PATENT AND TRADEMARK OFFICE
CERTIFICATE OF CORRECTION

PATENT NO.        : 8,179,517 B2
APPLICATION NO.   : 11/915886
DATED             : May 15, 2012
INVENTOR(S)       : Tomoharu Fujiwara Page 1 of 1

It is certified that error appears in the above-identified patent and that said Letters Patent is hereby corrected as shown below:

On the Title Page:

Add item (30) as follows:

(30) Foreign Application Priority Data

June 30, 2005  (JP) .....................................2005-191561

Signed and Sealed this
Twenty-ninth Day of January, 2013

David J. Kappos
*Director of the United States Patent and Trademark Office*